United States Patent
Ashley et al.

(10) Patent No.: US 7,487,432 B2
(45) Date of Patent: Feb. 3, 2009

(54) METHOD AND APPARATUS FOR MULTIPLE STEP VITERBI DETECTION WITH LOCAL FEEDBACK

(75) Inventors: Jonathan James Ashley, Los Gatos, CA (US); Erich Franz Haratsch, Bethlehem, PA (US)

(73) Assignee: Agere Systems Inc., Allentown, PA (US)

(*) Notice: Subject to any disclaimer, the term of this patent is extended or adjusted under 35 U.S.C. 154(b) by 539 days.

(21) Appl. No.: 10/853,087

(22) Filed: May 25, 2004

(65) Prior Publication Data

US 2005/0268210 A1    Dec. 1, 2005

(51) Int. Cl.
    *H03M 13/03* (2006.01)
(52) U.S. Cl. ............... 714/796; 714/791; 714/792; 714/795; 375/262; 375/265; 375/341
(58) Field of Classification Search ......... 714/791–796; 375/262, 265, 341
    See application file for complete search history.

(56) References Cited

U.S. PATENT DOCUMENTS

| | | | |
|---|---|---|---|
| 5,042,036 A * | 8/1991 | Fettweis .................. 714/795 |
| 5,136,593 A | 8/1992 | Moon et al. |
| 5,220,570 A | 6/1993 | Lou et al. |
| 5,280,489 A * | 1/1994 | Fredrickson et al. ....... 714/788 |
| 5,291,523 A | 3/1994 | Bergmans et al. |
| 5,844,946 A | 12/1998 | Nagayasu |
| 5,870,433 A | 2/1999 | Huber et al. |
| 5,881,106 A | 3/1999 | Cartier |
| 5,910,968 A | 6/1999 | Chouly et al. |
| 5,970,104 A | 10/1999 | Zhong et al. |
| 6,035,006 A | 3/2000 | Matui |
| 6,088,404 A | 7/2000 | Jekal |
| 6,201,831 B1 | 3/2001 | Agazzi et al. |
| 6,690,739 B1 | 2/2004 | Mui |
| 2002/0021770 A1* | 2/2002 | Beerel et al. ............. 375/340 |
| 2002/0083396 A1* | 6/2002 | Azadet et al. ............ 714/796 |
| 2005/0044474 A1* | 2/2005 | Zaboronski et al. ....... 714/794 |

OTHER PUBLICATIONS

U.S. Appl. No. 09/471,920, filed Dec. 23, 1999, Azadet et al.
U.S. Appl. No. 09/834,668, filed Apr. 13, 2001, Azadet et al.
Azadet, K., "Gigabit Ethernet Over Unshielded Twisted Pair Cables," Bell Laboratories, Lucent Technologies, Holmdel, NJ, USA.
Bednarz et al., "Design Performance, and Extensions of the RAM-DFE Architecture," IEEE Transactions on Magnetics, vol. 31, No. 2, pp. 1196-1201 (Mar. 1995).
Black et al., "A 140-Mb/s, 32-State, Radix-4 Viterbi Decoder," IEEE Journal of Solid-State Circuits, vol. 27, No. 12 (Dec. 1992).

(Continued)

*Primary Examiner*—Guy J Lamarre
(74) *Attorney, Agent, or Firm*—Ryan, Mason & Lewis, LLP

(57) ABSTRACT

A reduced-state Viterbi detector is disclosed that precomputes branch metrics for a multiple-step trellis for speculative sequences of one or more channel symbols; selects one of said precomputed branch metrics for multi-step state transitions based on at least one multi-step decision from at least one corresponding state; and selects a path having a best path metric for a given state.

25 Claims, 14 Drawing Sheets

OTHER PUBLICATIONS

Chevillat et al., "Decoding of Trellis-Encoded Signals in the Presence of Intersymbol Interference and Noise," IEEE Transactions on Communications, vol. 37, No. 7 (Jul. 1989).

Cypher et al., "Generalized Trace-Back Techniques for Survivor Memory Management in the Viterbi Algorithm," Journal of VLSI Signal Processing, 5, pp. 85-94 (1993).

Fettweis et al., "High-Speed Parallel Viterbi Decoding: Algorithm and VLSI-Architecture," IEEE Communications Magazine (May 1991).

Haratsch, E.F., "High-Speed VLSI Implementation of Reduced Complexity Sequence Estimation Algorithms with Applications to Gigabit Ethernet 1000Base-T," Bell Laboratories, Lucent Technologies, Holmdel, NJ, USA.

Haratsch, E.F., "Viterbi Dectector Architectures for Magnetic Recording," VLSI Technology, Systems, and Applications, 2003 International Symposium, pp. 239-242 (Oct. 6-8, 2003).

Parhi, K.K., "Pipelining in Algorithms with Quantizer Loops," IEEE Transactions on Circuits and Systems, vol. 38, No. 7, pp. 745-754 (Jul. 1991).

Rizos et al., "Reduced-Complexity Sequence Detection Approaches for PR-Shaped, Coded Linear Modulations," IEEE Global Telecommunications Conference, vol. 1, pp. 342-346 (Nov. 1997).

* cited by examiner

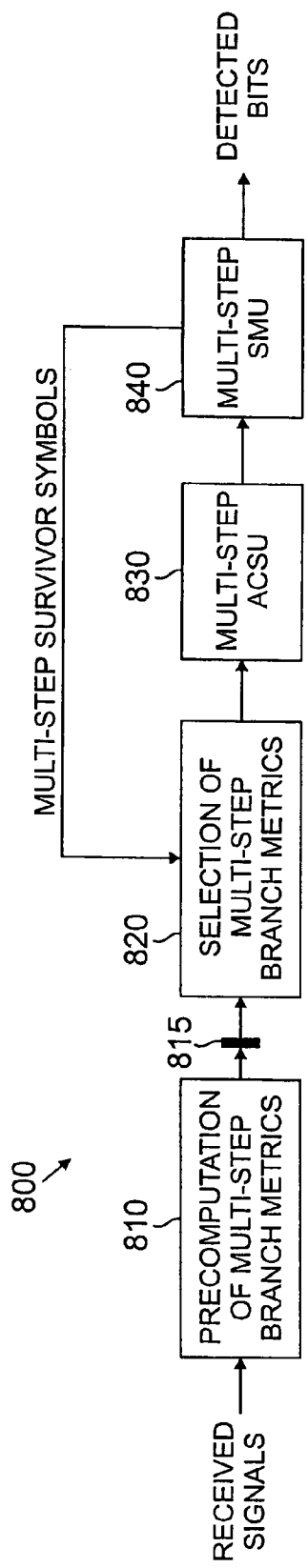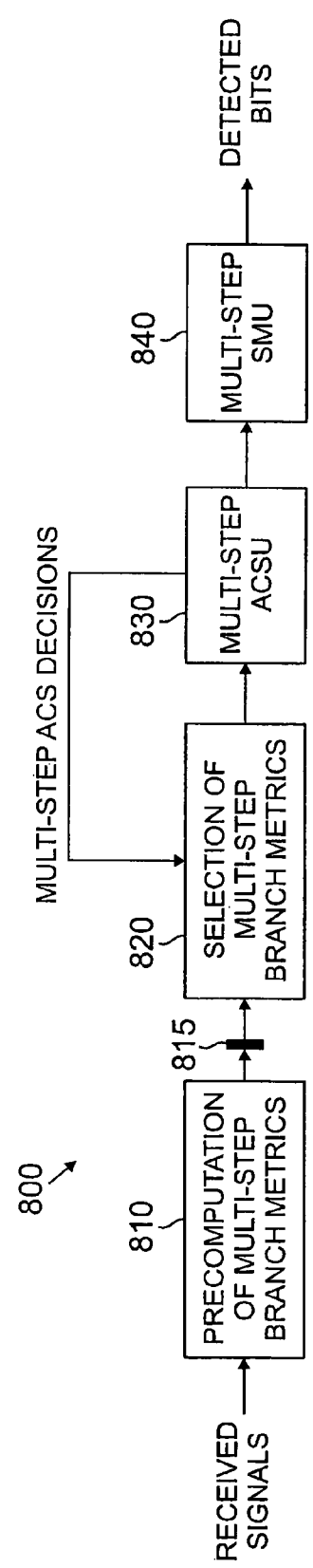
FIG. 8A
FIG. 8B

METHOD AND APPARATUS FOR MULTIPLE STEP VITERBI DETECTION WITH LOCAL FEEDBACK

CROSS-REFERENCE TO RELATED APPILCATIONS

The present application is related to U.S. patent application Ser. No. 10/839,784, entitled "Method and Apparatus for Generating Filter Tap Weights and Biases for Signal Dependent Branch Metric Computation," filed on May 6, 2004 and U.S. patent application Ser. No. 10/853,090, entitled "Method and Apparatus for Reduced-State Viterbi Detection in a Read Channel of a Magnetic Recording System," U.S. patent application Ser. No. 10/853,089, entitled "Method and Apparatus for Precomputation and Pipelined Selection of Branch Metrics in a Reduced-State Viterbi Detector," and U.S. patent application Ser. No. 10/853,088, entitled "Method and Apparatus for Precomputation and Pipelined Selection of Intersymbol Interference Estimates in a Reduced-State Viterbi Detector," each filed contemporaneously herewith, and each incorporated by reference herein.

FIELD OF THE INVENTION

The present invention relates generally to equalization, detection and decoding techniques and, more particularly, to sequence estimation techniques with reduced complexity.

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well, (i.e., the channel impulse response becomes longer). In read channel chips, a Viterbi detector is typically used to detect the read data bits in the presence of intersymbol interference and noise. When the channel impulse response is long, however, the hardware complexity associated with the Viterbi detector becomes prohibitively large, as the number of states considered by the Viterbi detector grows exponentially with the length of the channel impulse response. A number of techniques have been proposed or suggested for reducing the complexity of Viterbi detectors.

For example, the hardware complexity of the Viterbi detector can be reduced by using a reduced-state trellis that considers only a shortened impulse response, and canceling intersymbol interference due to the tail of the impulse response for each state by using past survivor symbols as local feedback. See, e.g., J. W. M. Bergmans, "Digital Baseband Transmission and Recording," Kluwer Academic Publishers, 326 (1996) or U.S. Pat. No. 6,690,754, issued to Haratsch et al., entitled "Method and Apparatus for Reducing the Computational Complexity and Relaxing the Critical Path of Reduced-State Sequence Estimation (RSSE) Techniques," incorporated by reference herein The error rate performance of reduced-state Viterbi detectors with local feedback can approach the performance of full-state Viterbi detectors without local feedback that implement maximum likelihood sequence estimation (MLSE). The maximum achievable data rate of a Viterbi detector implementation with local feedback, however, is considerably lower compared to a Viterbi detector implementation without local feedback, as significantly more operations have to be performed within one clock period. A need therefore exists for a method and apparatus for performing reduced-state Viterbi detection with local feedback at the high data rates that are required by evolving high-end storage applications.

SUMMARY OF THE INVENTION

Generally, a method and apparatus are disclosed for improving the maximum data rate of reduced-state Viterbi detectors with local feedback. The maximum data rate that may be achieved by the disclosed reduced-state Viterbi detectors is improved by transforming an original one-step reduced-state trellis into a multi-step reduced-state trellis and then procomputing the branch metrics for the multi-step trellis. The correct branch metrics are selected based on multi-step survivor symbols or multi-step ACS decisions. Thus, the present invention removes the computations of ISI estimates and branch metrics from the critical path of the disclosed reduced-state Viterbi detectors.

A reduced-state Viterbi detector is thus disclosed that precomputes branch metrics for a multiple-step trellis for speculative sequences of one or more channel symbols; selects one of said precomputed branch metrics for multi-step state transitions based on at least one multi-step decision from at least one corresponding state; and selects a path having a best path metric for a given state.

A more complete understanding of the present invention, as well as further features and advantages of the present invention, will be obtained by reference to the following detailed description and drawings.

BRIEF DESCRIPTION OF THE DRAWINGS

FIG. 8A is a schematic block diagram of a reduced-state Viterbi detector incorporating features of the present invention;

FIG. 8B is a schematic block diagram of an alternative reduced-state Viterbi detector incorporating features of the present invention;

DETAILED DESCRIPTION

The present invention recognizes that the limitation on achievable data rates imposed by the local feedback loops in a reduced-state Viterbi detector is overcome by precomputing branch metrics for a multi-step trellis. Correct branch metrics for multi-step state transitions are selected based on corresponding multi-step survivor symbols or multi-step ACS decisions. Multi-step survivor symbols and multi-step ACS decisions are essentially equivalent to groups (e.g., pairs for a two-step trellis) of one-step survivor symbols and one-step ACS decisions, respectively. The multi-step trellis is obtained from a one-step trellis by collapsing transitions over multiple time steps into one. In other words, each transition in the multi-step trellis corresponds to multiple transitions in the one-step trellis. For example, in an exemplary two-step trellis, each transition in the two-step trellis corresponds to two transitions in the original one-step trellis. Reduced-state Viterbi detectors with local feedback loops in accordance with the present invention can operate at data rates that are at least about twice the data rates of conventional one-step designs without any precomputation when a two-step trellis is used. Even larger speed-ups are achievable for step sizes larger than two.

For a detailed discussion of reduced-state Viterbi detection with local feedback, which is also known as Reduced-State Sequence Estimation (RSSE), (Delayed) Decision-Feedback Sequence Estimation (DFSE), and Parallel Decision-Feedback Equalization (PDFE), see, for example, U.S. Pat. No. 6,690,754 to Haratsch et al., entitled "Method and Apparatus for Reducing the Computational Complexity and Relaxing the Critical Path of Reduced-State Sequence Estimation (RSSE) Techniques," incorporated by reference herein, and the references cited therein. See also, Lee and Messerschmidt, "Digital Communication," Kluwer Academic Publishers, 2$^{nd}$ ed. (1994).

Figure 1:
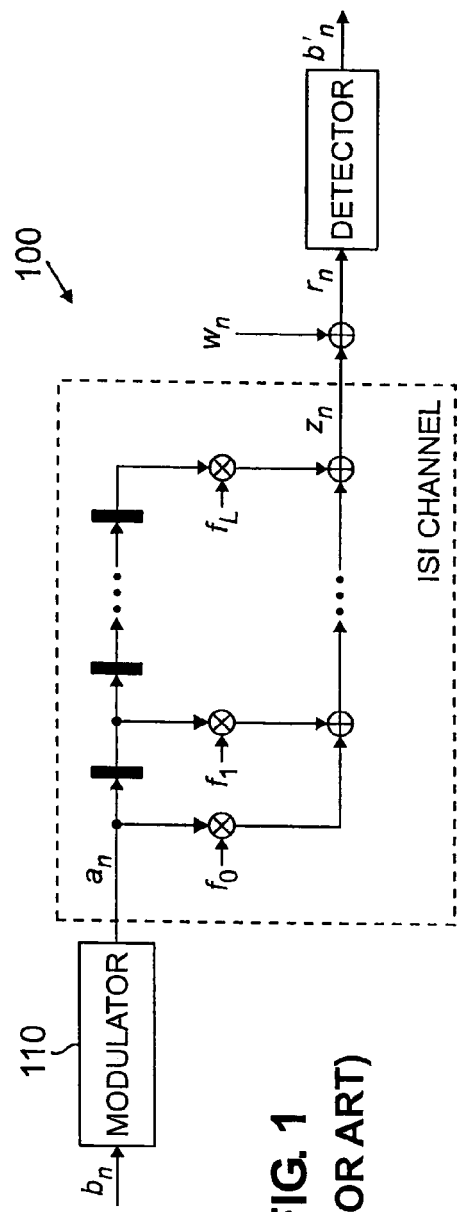
FIG. 1 is a schematic block diagram of a conventional system model for a baseband communications channel with ISI and additive noise.

FIG. 1 is a schematic block diagram of a conventional system model for a baseband communications channel 100 with ISI and additive noise. While the exemplary embodiment is discussed in the context of baseband communications, the techniques discussed herein can also be applied to passband communications systems, as would be apparent to a person of ordinary skill in the art. Further, while it is assumed that trellis-coded modulation (TCM) is not employed for ease of illustration, the disclosed techniques generalize to communication systems using TCM or other modulation schemes.

The modulator 110 maps an information symbol $b_n$ into a channel symbol $\alpha_n$. For ease of illustration, it is assumed that the number of information bits per information symbol is one. In other words, the information symbol $b_n$ is equivalent to a single information bit $b_n$. The modulator 110 maps an information symbol $b_n$ to a two-level channel symbol $\alpha_n$ according to following rule:

$$a_n = \begin{cases} -1, & b_n = 0 \\ 1, & b_n = 1 \end{cases}. \tag{1}$$

The techniques discussed herein can easily be applied to other modulation schemes with more than two signal levels. For a discussion of reduced-state Viterbi detection for an exemplary modulation scheme with five signal levels, see, U.S. patent application Ser. No. 09/471,920, entitled, "Method and Apparatus for Shortening the Critical Path of Reduced Complexity Sequence Estimation Techniques," incorporated by reference herein.

The ISI channel 100 is modeled as an FIR filter, and the channel output at time n is given by $$r_n = z_n + w_n = \sum_{i=0}^{L} f_i \cdot a_{n-i} + w_n, \tag{2}$$

where $z_n$ is the ISI channel output, $\{f_i\}$, $0 \leq i \leq L$ are the channel coefficients, L is the channel memory, and $w_n$ is noise. The decision of a detector 120 that corresponds to $b_n$ is denoted by $b_n'$.

The ISI channel output $z_n$ depends on the current channel symbol $\alpha_n$ and the past L transmitted channel symbols $\{\alpha_{n-i}\}$, $1 \leq i \leq L$. This output can be described as a function of the L past transmitted channel symbols using a finite state machine (FSM) model, where the channel state at time n is defined by $$\alpha_n = (\alpha_{n-1}, \alpha_{n-2}, \ldots, \alpha_{n-L}). \tag{3}$$

L will also be Referred to herein as the Memory of the FSM Process.

The channel state is equivalently defined in terms of the L past transmitted information bits:

$$\beta_n = (b_{n-1}, b_{n-2}, \ldots, b_{n-L}). \tag{4}$$

It is apparent from equations (3) or (4) that the number of channel states is given by $$2^L. \tag{5}$$

To simplify the notation, the integer value corresponding to the vector $(b_{n-1}, \ldots, b_{n-L+1}, b_{n-L})$ will be used to represent the channel state $\beta_n$. For example, $0_n$ will stand for $\beta_n = (0, \ldots, 0,0)$, and $1_n$ will stand for $\beta_n = (0, \ldots, 0,1)$.

Figure 2:
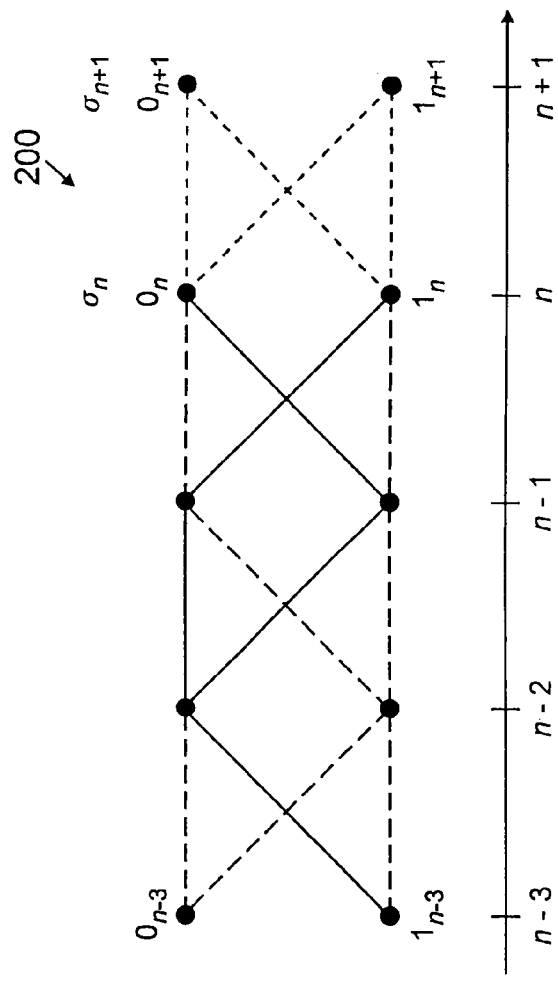
FIG. 2 illustrates a trellis diagram for a channel with memory L=1.

The FSM process describing the ISI channel 100 can be visualized using a trellis diagram 200, shown in FIG. 2, for a channel with memory L=1. For the considered exemplary uncoded channel model, a trellis state at time n is denoted by $\sigma_n$, and is equal to the channel state, i.e., $\sigma_n = \beta_n$. In FIG. 2, solid lines correspond to survivor paths, dotted lines to discarded transitions, and dashed lines to path extensions. There are two channel states, and two branches corresponding to the information symbols $b_n=0$ and $b_n=1$ leave each state $\sigma_n$ to reach respective successor states $\{\sigma_{n+1}\}$. It can be seen from equation (5) that the number of channel states grows exponentially with respect to the channel memory.

FIG. 2 depicts the operation of the Viterbi algorithm at time step n. At this point, the Viterbi algorithm has already determined the survivor path into state $0_n$, which corresponds to the surviving state sequence $\{0_n, 1_{n-1}, 0_{n-2}, 1_{n-3}, \ldots\}$. The survivor path into state $1_n$ corresponds in this example to the state sequence $\{1_n, 0_{n-1}, 0_{n-2}, 1_{n-3}, \ldots\}$. Based on these two survivor paths, the Viterbi algorithm decides on the survivor paths into states $0_{n+1}$ and $1_{n+1}$, in the manner described below.

First, the Viterbi algorithm calculates branch metrics for the state transitions from $\sigma_n$ to $\sigma_{n+1}$. For a channel with additive white Gaussian noise, the optimum branch metric is the Euclidean distance between the received symbol $r_n$ and the ideal ISI channel output $z_n$ that corresponds to the respective state transition. For a transition from state $\sigma_n$, the branch metric is given by $$\lambda_n(\sigma_n, a_n) = (r_n - z_n)^2 = \left( r_n - \sum_{i=0}^{L} f_i \cdot a_{n-i} \right)^2, \quad (6)$$

where $\alpha_n$ is the channel symbol that is associated with a transition from state $\sigma_n$ to a successor state $\sigma_{n+1}$. The techniques described herein are independent from the way branch metrics are computed, i.e., branch metrics can also by computed by using the absolute value of the difference between the received symbol $r_n$ and the ideal ISI channel output $z_n$.

In the trellis 200 of FIG. 2, there are two path extensions into any state $\sigma_{n+1}$, e.g., state $0_{n+1}$ can be reached from states $0_n$ and $1_n$. Out of the two path extensions into a particular state $\sigma_{n+1}$, the Viterbi algorithm keeps only the one extension with the smaller path metric, as it corresponds to the most likely path into this state. The metric for the path that emanates from state $\sigma_n$ and leads into $\sigma_{n+1}$ is calculated by adding the path metric for the preceding state $\sigma_n$, $\Gamma_n(\sigma_n)$ and the branch metric $\lambda_n(\sigma_n, \alpha_n)$ for the transition.

The three operations to determine the best survivor path into a new state $\sigma_{n+1}$, i.e., adding up corresponding path metrics of predecessor states $\sigma_n$ and branch metrics for the extensions into the new state $\sigma_{n+1}$, comparing the path metrics of these extended sequences, and selecting the extension with the minimum path metric as the survivor sequence for the new state, are referred to as add-compare-select (ACS), which can be described by the following equation:

$$\Gamma_{n+1}(\sigma_{n+1}) = \min_{\{\sigma_n\} \to \sigma_{n+1}} (\Gamma_n(\sigma_n) + \lambda_n(\sigma_n, a_n)). \quad (7)$$

As previously indicated, the invention can also be applied when branch metrics are computed differently. As known in the art, for certain branch metric definition, the best path into a state is given by the path with the maximum (instead of minimum) path metric. For such cases, the ACS operation described by equation (7) involves a maximum instead of a minimum operation.

In the example of FIG. 2, the two survivor sequences into states $0_n$ and $1_n$ merge into a single path at time step n−2. In general, all survivor paths merge into a single path after some detection delay D with high probability. Thus, information symbols can be uniquely detected from this time step on. Therefore, it is possible to implement the Viterbi algorithm with a fixed detection delay. It is not required to process the whole transmitted sequence before the first information symbols can be detected. Generally, the detection delay D should be approximately five times the memory of the underlying FSM process. For ISI channels, the memory is equal to L. Typically, a good value for D is determined by running error rate simulations for different values of D.

Figure 3:
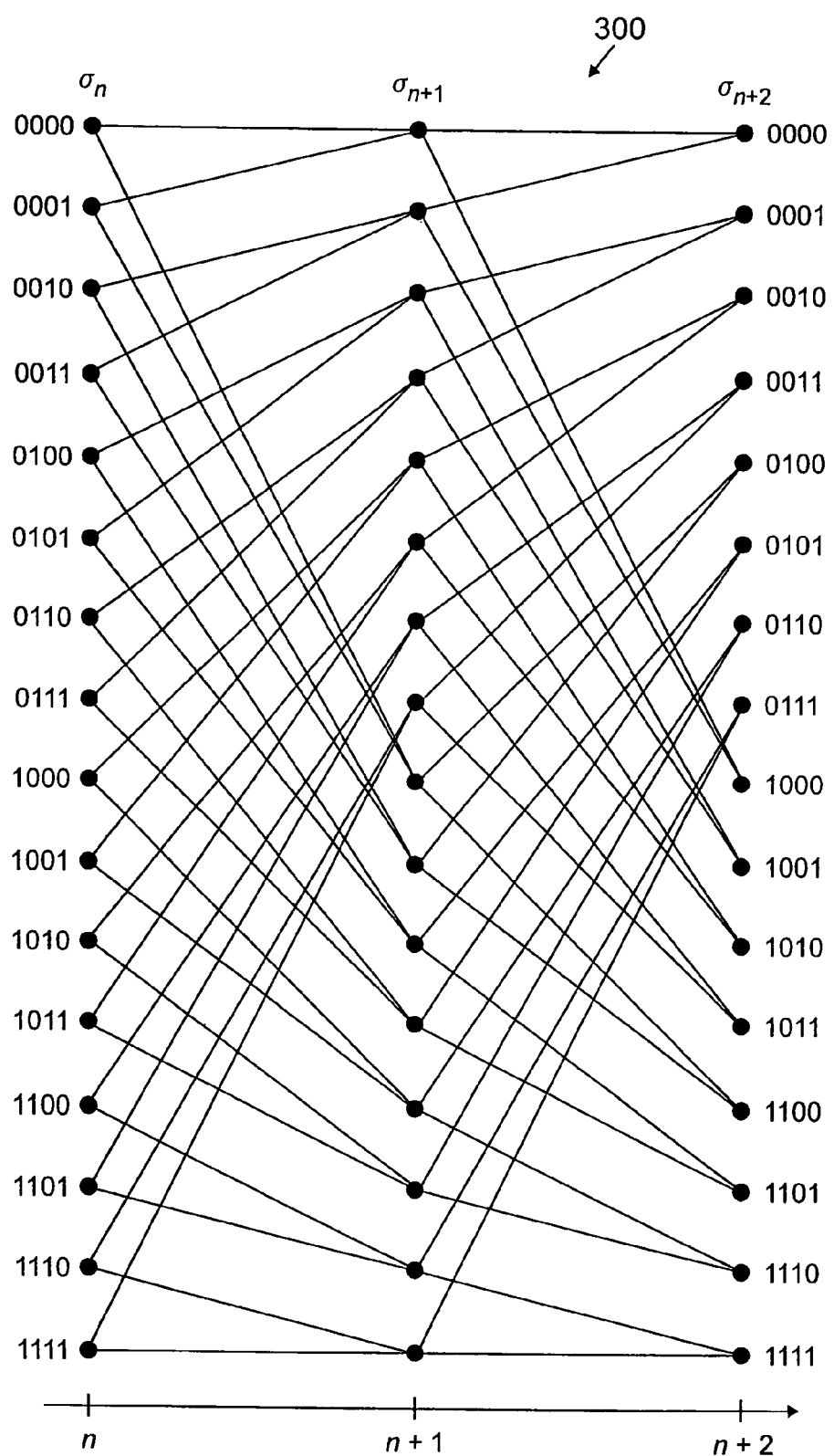
FIG. 3 illustrates a trellis diagram for a channel having a memory L=4.

FIG. 3 illustrates a trellis 300 describing an ISI channel having a memory L=4. A trellis state at time n is denoted by $\sigma_n$, and for the considered exemplary uncoded channel model, it is equal to the channel state, i.e., $\sigma_n = \beta_n$. There are 16 channel states, and two branches corresponding to the information symbols $b_n=0$ and $b_n=1$ leave each state $\sigma_n$ to reach respective successor states $\{\sigma_{n+1}\}$.

Reduced-State Viterbi Detection with Local Feedback

As indicated above, the disadvantage of MLSE is that its complexity grows exponentially with the channel memory. Considering fewer states for the detection of the most likely data sequence reduces the required hardware or computational effort. Reduced-state Viterbi Detection with local feedback accomplishes this by merging several separate states into one single reduced state and keeping only one survivor path per reduced state. The ISI that is not considered in the reduced state is cancelled for each reduced state by using channel symbols from the corresponding survivor path in a local feedback fashion. Reduced-state Viterbi detection with local feedback is also known as Reduced-State Sequence Estimation (RSSE), (Delayed) Decision-Feedback Sequence Estimation (DFSE), and Parallel Decision-Feedback Equalization (PDFE).

In the simplest variant of RSSE, a reduced state $\beta_n'$ is obtained by not considering all L information symbols, but only the past K information symbols for the definition of a trellis state:

$$\beta_n' = (b_{n-1}, b_{n-2}, \ldots, b_{n-K}) \; 0 \leq K \leq L, \quad (8)$$

where K is referred to as the truncated channel memory. The number of states in the reduced-state trellis is then given by $$2^K. \quad (9)$$

The reduced state $\beta_n'$ does not contain information about the ISI caused by the channel symbols $(\alpha_{n-K-1}, \alpha_{n-K-2}, \ldots, \alpha_{n-L})$. Conceptually, this reduced state is obtained by grouping all original states $\beta_n$ as defined in Equation (4) with the same information symbol sequence $(b_{n-1}, b_{n-2}, \ldots, b_{n-K})$, but different sequences $(b_{n-K-1}, b_{n-K-2}, \ldots, b_{n-L})$ into one single reduced state $\beta_n'$. Therefore, this reduced state does not make any statement about the ISI associated with the channel coefficients $(f_{K+1}, f_{K+2}, \ldots, f_L)$. But an estimate for this ISI component can be computed by considering the respective channel symbols from the survivor sequence into this state. The ISI corresponding to a state is not known a-priori as in MLSE, but must be determined at each detection step by using channel symbols from the corresponding survivor path. Let $\sigma_n$ denote a state in the reduced-state trellis, i.e., $\sigma_n = \beta_n'$. The ISI estimate $u_n(\sigma_n)$ for a state $\sigma_n$ is calculated at time step n as $$u_n(\sigma_n) = \sum_{i=1}^{K} f_i \cdot a_{n-i} + \sum_{i=K+1}^{L} f_i \cdot \hat{a}_{n-i}(\sigma_n), \quad (10)$$

where $\hat{\alpha}_{n-i}(\sigma_n)$ is the channel symbol that corresponds to the survivor sequence into state $\sigma_n$ and that is associated with trellis step n–i. The first term on the right hand side of equation (10) computes the ISI component that is known a-priori due to the definition of the reduced state in equation (8). The second term on the right hand side of equation (10) is the ISI component caused by channel taps that were ignored in the reduced-state definition of equation (8). This ISI term is calculated at each detection step for a given state by using respective survivor symbols as local feedback.

With the ISI estimate $u_n(\sigma_n)$ the branch metric for the transition that emanates from state $\sigma_n$ to reach a successor state $\sigma_{n+1}$ and corresponds to channel symbol $\alpha_n$ can be computed as:

$$\lambda_n(\sigma_n, \alpha_n) = (r_n - f_0 \cdot \alpha_n - u_n(\sigma_n))^2. \quad (11)$$

As in MLSE, the most likely survivor path into the state $\sigma_{n+1}$ with the path metric $\Gamma_{n+1}(\sigma_{n+1})$ among the path extensions from all possible predecessor states $\{\sigma_n\}$ is determined with an ACS operation:

$$\Gamma_{n+1}(\sigma_{n+1}) = \min_{\{\sigma_n\} \to \sigma_{n+1}} (\Gamma_n(\sigma_n) + \lambda_n(\sigma_n, a_n)). \quad (12)$$

The version of RSSE where a reduced state is defined by considering just a truncated channel memory as in equation (8) is referred to as (Delayed) Decision-Feedback Sequence Estimation (DFSE), described, for example, in A. Duel-Hallen and C. Heegard, "Delayed Decision-Feedback Sequence Estimation," IEEE Transaction on Communications, 428-436 (May 1989). A reduced-state trellis can also be constructed by applying set partitioning principles to the channel symbol alphabet, as suggested in M. V. Eyuboglu and S. U. Qureshi, "Reduced-State Sequence Estimation With Set Partitioning and Decision-Feedback," IEEE Transactions on Communications, 13-20 (January 1988). Recently, even more general rules for the definition of reduced states were given in B. E. Spinnler and J. Huber, "Design of Hyper States for Reduced-State Sequence Estimation,", AEÜ (Electronics and Communication), 17-26 (1996). The present invention can be applied to such general RSSE methods. In addition, the present invention can be applied to another subclass of RSSE, referred to as Parallel Decision-Feedback Equalization, described in Lee and Messerschmidt, "Digital Communication," $2^{nd}$ ed. (1994). These publications are each incorporated by reference herein.

Figure 4:
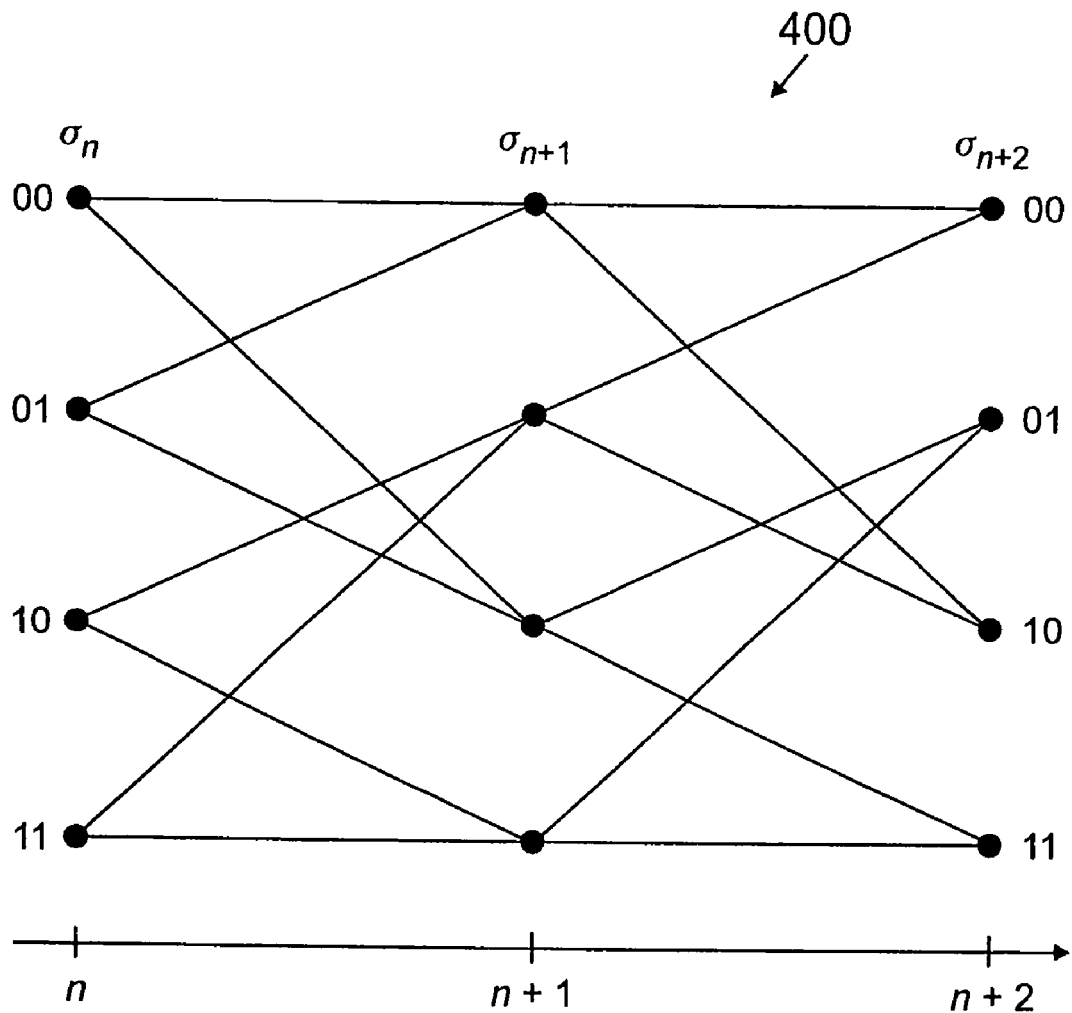
FIG. 4 illustrates a reduced-state trellis diagram corresponding to the full state trellis of FIG. 3, for a channel having a memory L=4 and a shortened channel memory K=2.

Now, RSSE will be explained for the case that L=4 and K=2. Then, a state in the reduced-state trellis is defined according to equation (8) as:

$$\beta_n' = (b_{n-1}, b_{n-2}) \quad (13)$$

and the number of states in the reduced-state trellis is equal to $2^2=4$. FIG. 4 illustrates the reduced-state trellis 400 corresponding to the full state trellis 300 of FIG. 3 that describes an ISI channel having a memory L=4. A state at time n in the reduced-state trellis is denoted by $\sigma_n$, i.e., $\sigma_n = \beta_n'$. There are four channel states, and two branches corresponding to the information symbols $b_n=0$ and $b_n=1$ leave each state $\sigma_n$ to reach respective successor states $\{\sigma_{n+1}\}$.

Figure 5:
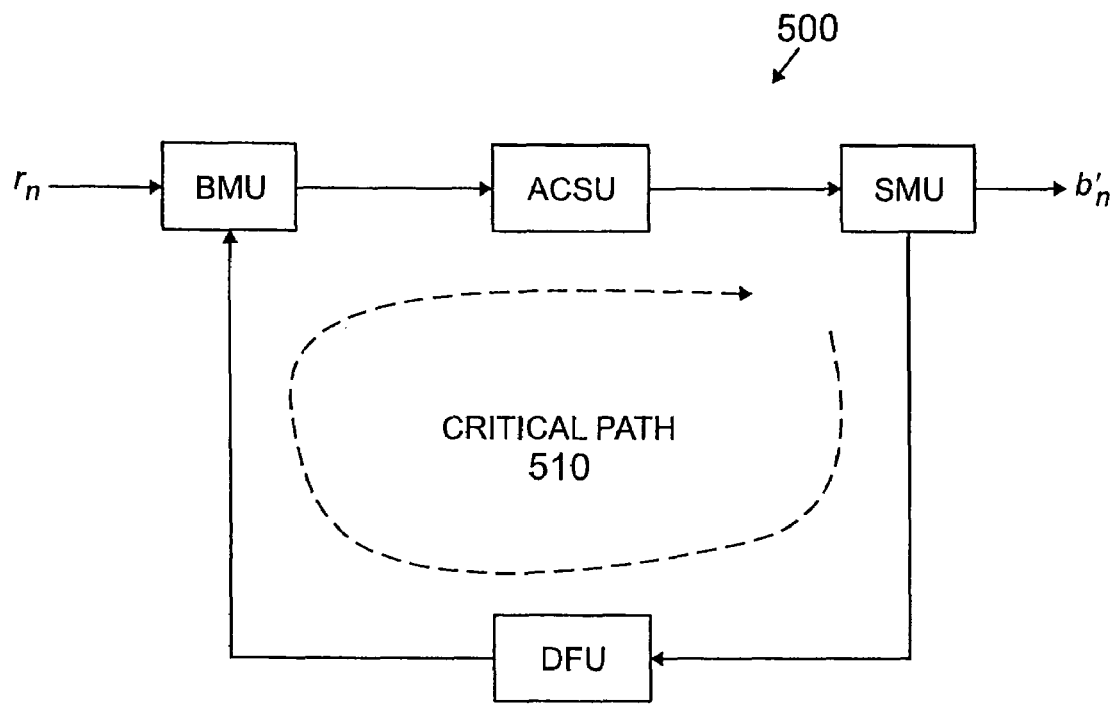
FIG. 5 is a schematic block diagram for an exemplary conventional reduced-state Viterbi detector with local feedback.

FIG. 5 is a schematic block diagram for an exemplary conventional reduced-state Viterbi detector 500 with local feedback. As shown in FIG. 5, the reduced-state detector 500 includes a decision-feedback unit (DFU) that computes separate ISI estimates for each trellis state according to equation (10) using local feedback, a branch metric unit (BMU) that computes branch metrics for all transitions, an add-compare-select unit (ACSU) that determines the best survivor path into each state, and a survivor memory unit (SMU) that stores the survivor paths.

As shown in FIG. 5, due to the local feedback the critical path 510 is comprised of a recursive loop that includes each of the processing blocks (i.e., the BMU, ACSU, SMU and DFU). As all operations along this critical path 510 have to be performed within one clock period, this recursive loop limits the maximum achievable data rate. Therefore, the maximum data rate of a reduced-state Viterbi detector with local feedback is significantly lower than the maximum data rate of a Viterbi detector without local feedback, which is only limited by the ACS function.

Figure 6A:
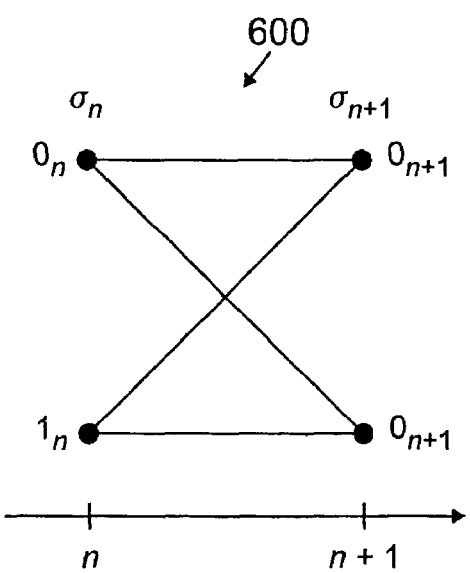
FIG. 6A illustrates a trellis diagram for a channel having a memory L=4 and a shortened channel memory K=1.
Figure 6B:
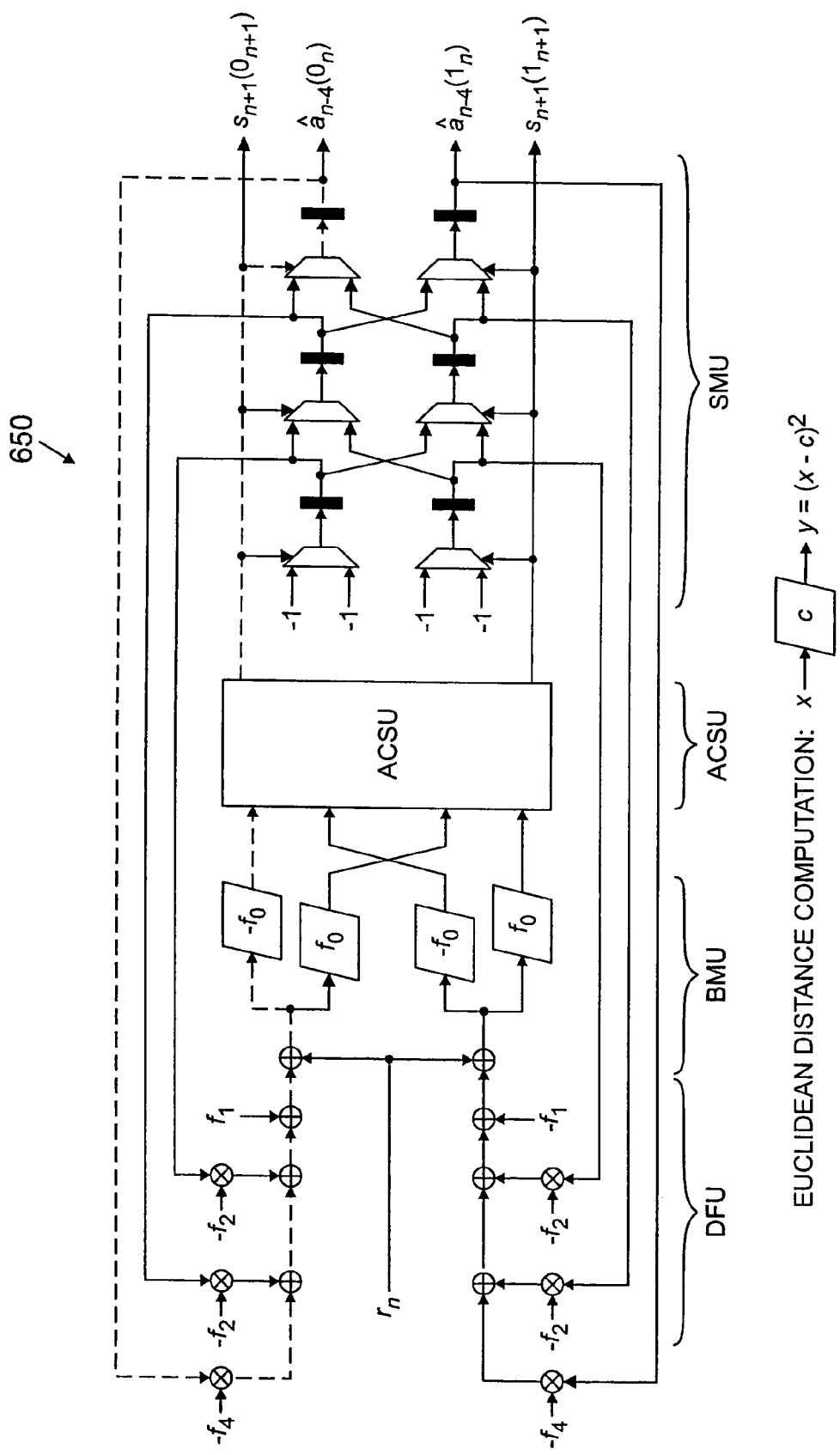
FIG. 6B illustrates a detailed state-parallel implementation of an reduced-state Viterbi detector with local feedback corresponding to the trellis of FIG. 6A.

FIG. 6B illustrates a detailed state-parallel reduced-state Viterbi detector implementation 650 with local feedback corresponding to the trellis 600 of FIG. 6A, having a memory L=4 and a shortened channel memory K=1. $\hat{\alpha}_{n-4}(0_n)$ is the survivor symbol for time step n–4 from the survivor path into state $0_n$. $s_{n+1}(0_{n+1})$ is the ACS decision for the two path extensions into state $0_{n+1}$. The part of the SMU that stores the L–K survivor symbols $\hat{\alpha}_{n-K-1}(\sigma_n), \hat{\alpha}_{n-K-2}(\sigma_n), \ldots \hat{\alpha}_{n-L}(\sigma_n)$ for each reduced state is implemented with a register-exchange-architecture, as these decisions are required for the computation of ISI estimates in the DFU without delay. The implementation of the SMU using a register-exchange architecture is described, e.g., in R. Cypher and C. B. Shung, "Generalized Trace-Back Techniques for Survivor Memory Management in the Viterbi Algorithm," Journal of VLSI Signal Processing, 85-94 (1993). Because the discussed exemplary channel uses two signal levels, the multipliers in the DFU can be implemented with a shift operation. The squaring operation for the Euclidean distance computation in the BMU can be approximated using random logic or a look-up table.

Reduced-state Viterbi detection with local feedback that implements, e.g., RSSE, is associated with less computational complexity than full-state Viterbi detection that implements MLSE for the same channel memory L, as it processes less states. However, this comes at the expense of a significantly longer critical path due to the local feedback of survivor symbols, which is drawn in FIG. 6B using dotted lines. The critical path comprises one symbol multiplication and L–K additions in the DFU (the first term in the right hand side of equation (10) can be computed outside the loop), one addition, subtraction and squaring operation in the BMU, one add-compare in the ACSU, and a 2-to-1 MUX in the SMU. All the operations along this critical path must be completed within one symbol period and cannot be pipelined. In contrast to this, the critical path in a Viterbi detector just comprises the ACS operation. Therefore, the maximum data rate of a reduced-state Viterbi detector implementation with local feedback is potentially significantly lower compared to a Viterbi detector that performs MLSE. Furthermore, the maximum throughput of a reduced-state Viterbi detector implementation with local feedback depends on the channel memory such that it decreases for increasing L.

Multi-Step Detection

The present invention employs two techniques to increase the maximum data rate that may be achieved by the reduced-state sequence estimator 500. First, as discussed below in conjunction with FIG. 7, the original one-step reduced-state trellis 400 is transformed into a multi-step reduced-state trellis 700. Second, as discussed below in conjunction with FIGS. 8A, 8B, 9A and 9B, the branch metrics are precomputed for the multi-step trellis 700, and the correct branch metrics are selected based on multi-step survivor symbols or multi-step ACS decisions. In this manner, the computations of ISI estimates and branch metrics are removed from the critical path.

Figure 7:
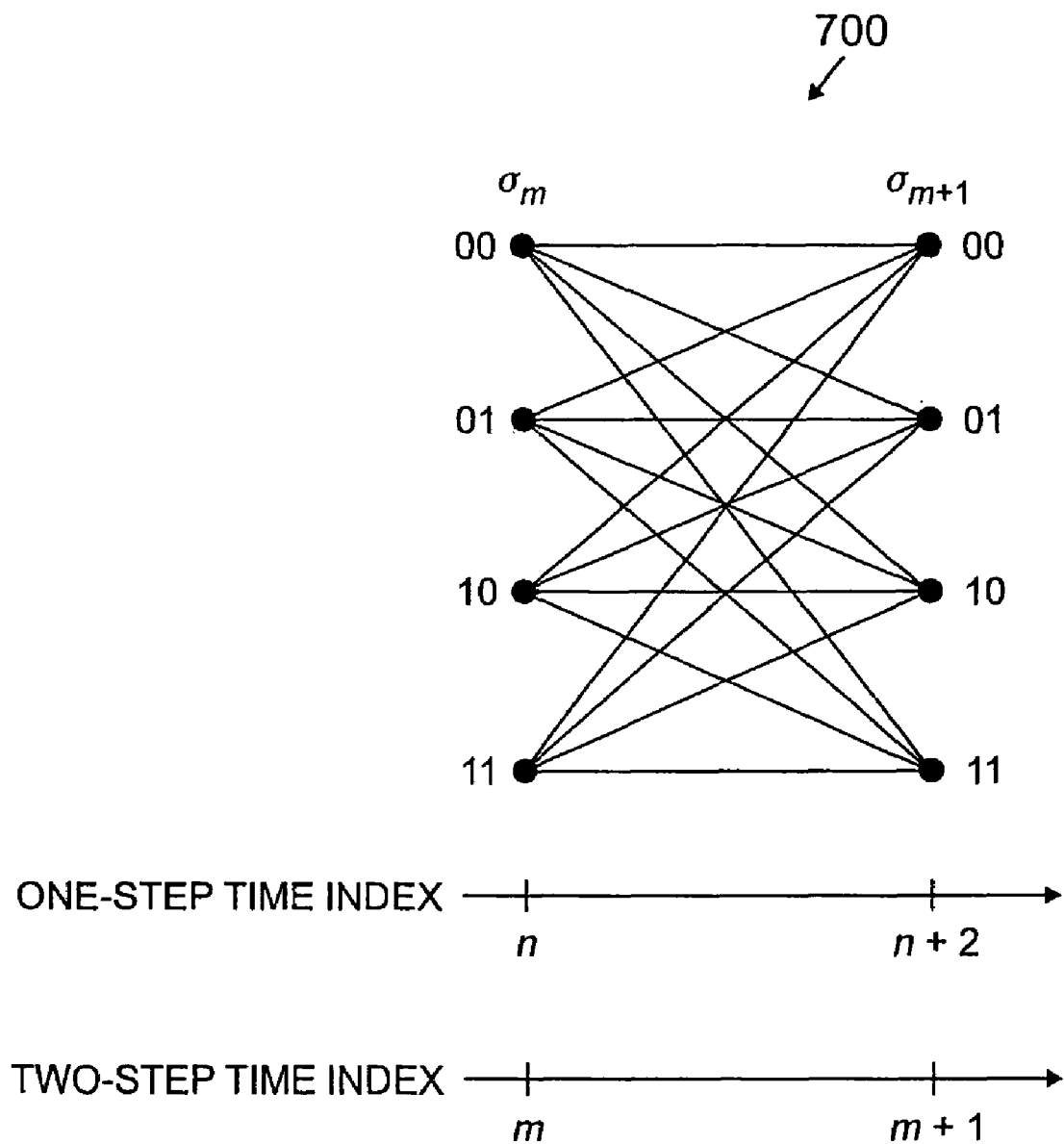
FIG. 7 illustrates a multi-step trellis in accordance with the present invention corresponding to the one-step trellis of FIG. 4.

FIG. 7 illustrates a multi-step trellis 700 corresponding to the one-step trellis 400 of FIG. 4, in accordance with the present invention. The trellises in both FIG. 4 and FIG. 7 are for the illustrative case that the channel memory is equal to L=4 and the truncated channel memory considered for the reduced state definition is equal to K=2. While the present invention is described using the exemplary two-step trellis of FIG. 7, the invention generalizes to cases where more than two steps are processed at once in a multi-step trellis, as would be apparent to a person of ordinary skill in the art. As shown in FIG. 7, when one step is processed in the multi-step trellis 700, multiple steps from the original one-step reduced-state trellis 400 are processed at once. In this manner, if a two-step trellis is used, the maximum data rate that can be achieved in a hardware implementation is effectively increased by at least a factor of about two compared to a one-step implementation using the architecture shown in FIG. 6B. A higher data rate increase can be achieved if more than two steps are processed at once in the multi-step trellis. While a given state in the one-step trellis 400 at time n can reach four states at time n+2 using four different combinations of two successive transitions, a given state in the multi-step trellis 700 at time n can reach four states at time n+2 using four different transitions. In FIG. 7, also the two-step time index m is shown, where m is the closest integer smaller than n/2 (m=floor(n/2)).

A state $\sigma_m$ in the two-step reduced-state trellis is defined according to:

$$\sigma_m = (b_{m-1}, b_{m-2}, b_{m-K/2}), \quad (14)$$

where $b_m$ is a two-step information symbol defined by:

$$b_m = (b_{n+1}, b_n). \quad (15)$$

Without loss of generality and for ease of illustration, it is assumed that the channel memory L and the shortened channel memory K are even.

In the exemplary multi-step trellis 700, two trellis transitions are collapsed into one. The present invention recognizes that performance of the ACS recursion on a multi-step trellis, such as the multi-step trellis 700, where several trellis transitions are collapsed into one, can increase the maximum throughput of a Viterbi detector. Well-known multi-step detection techniques, such as those described in P. J. Black and T. H.-Y. Meng, "A 140-Mb/s, 32-State, Radix-4 Viterbi Decoder," IEEE Journal of Solid-State Circuits, 1877-1885 (December 1992), G. Fettweis and H. Meyr, "High-Speed Parallel Viterbi Decoding: Algorithm and VLSI Architecture," IEEE Communications Magazine, 46-55 (May 1991), or H. K. Thapar and J. M. Cioffi, "A Block Processing Method for Designing High-Speed Viterbi Detectors," IEEE International Conference on Communications, 1096-1100 (June 1989), each incorporated by reference herein, cannot be directly applied to reduced-state Viterbi detection with local feedback such as RSSE, as branch metrics depend on previous survivor symbols. When branch metrics for multi-step transitions are precomputed, however, detection on a multi-step trellis, such as the multi-step trellis 700, becomes possible, and it can further increase the maximum throughput of an RSSE detector or other reduced-state Viterbi detectors with local feedback.

FIG. 8A is a schematic block diagram of a reduced-state Viterbi detector 800 with local feedback incorporating features of the present invention. FIG. 8B is a schematic block diagram of an alternative reduced-state Viterbi detector 800 with local feedback incorporating features of the present invention. As shown in FIGS. 8A and 8B, the branch metric computation is removed from the critical path by precomputing multi-step branch metrics at stage 810. For a detailed discussion of the precomputation of branch metrics for a one-step trellis, see, for example, U.S. patent application Ser. No. 09/471,920, entitled, "Method and Apparatus for Shortening the Critical Path of Reduced Complexity Sequence Estimation Techniques," incorporated by reference herein.

The correct multi-step branch metrics are selected at stage 820, discussed below in conjunction with FIG. 9A and FIG. 9B, based on multi-step survivor symbols (see FIGS. 8A and 9A) or multi-step ACS decisions (see FIGS. 8B and 9B). Multi-step survivor symbols are essentially equivalent to groups of one-step survivor symbols (e.g., one-step survivor symbol pairs for a two-step trellis), and multi-step ACS decisions are essentially equivalent to groups of one-step ACS decisions (e.g., one-step ACS decision pairs for a two-step trellis). For the exemplary two-step trellis 700 of FIG. 7, the multi-step branch metric selection 820, multi-step ACSU 830 and multi-step SMU 840 operate at half the original clock rate associated with the one-step trellis, where the original clock period is equal to the period of one step in the one-step trellis.

As previously indicated, the data rate can be increased by precomputing branch metrics and selecting the appropriate ones based on past survivor symbols. As shown in FIGS. 8A and 8B, a pipeline stage 815 can be inserted between the multi-step branch metric precomputation 810 and multi-step branch metric selection 820. In the implementation shown in FIG. 8A, the critical path comprises the multi-step branch metric selection 820, multi-step ACSU 830 and multi-step SMU 840. In the implementation shown in FIG. 8B, the critical path comprises the multi-step branch metric selection 820 and multi-step ACSU 830. However, the computation of ISI estimates and branch metrics is not part of the critical path in contrast to the conventional reduced-state Viterbi detection implementation shown in FIG. 6B.

In the exemplary channel model described above, the input into the reduced-state detector is given by equation (2), and a state in the reduced-state trellis is defined by equation (8). A state in the reduced-state trellis is denoted by $\sigma_n$, i.e., or, $\sigma_n = \beta_n'$. A one-step branch metric for the transition from state $\sigma_n$ to $\sigma_{n+1}$ that corresponds to the information bit sequence $b_n$, $b_{n-1}, \ldots b_{n-L}$ is given by $$\lambda_n(b_n b_{n-1} \ldots b_{n-L}) = \left( r_n - \sum_{i=0}^{L} f_i \cdot a_{n-i} \right)^2, \quad (16)$$

where $a_{n-i}$ is the channel symbol that corresponds to the information bit $b_{n-i}$. This is the same branch metric that was referred to as $\lambda_n(\sigma_n, \alpha_n)$ in the context of equation (11). To account for all possible bit sequences, $2^{L+1}$ one-step branch metrics have to be precomputed.

Let m=floor(n/2) be the time index for the two-step trellis 700 of FIG. 7. The branch metric for a two-step transition from state $\sigma_m$ to $\sigma_{m+2}$, i.e., from state $\sigma_m$ to $\sigma_{m+1}$ that corresponds to the information bit sequence $b_{n+1}, b_n, \ldots b_{n-L}$ is given by:

$$\lambda_m(b_{n+1} b_n \ldots b_{n-L}) = \lambda_{n+1}(b_{n+1} b_n \ldots b_{n-L+1}) + \lambda_n (b_n b_{n-1} \ldots b_{n-L}), \quad (17)$$

where $\lambda_n$ is the one-step branch metric that is computed as in equation (16). The one-step branch metric $\lambda_{n+1}$ for the transition from state $\sigma_{n+1}$ to $\sigma_{n+2}$ that corresponds to the information bit sequence $b_{n+1}, b_n, \ldots b_{n-L+1}$ is given by:

$$\lambda_{n+1}(b_{n+1}b_n \ldots b_{n-L+1}) = \left(r_{n+1} - \sum_{i=0}^{L} f_i \cdot a_{n+1-i}\right)^2. \quad (18)$$

For the considered reduced-state trellis shown in FIG. 7 with L=4 and K=2, branch metrics at time step m require two-bit survivor symbols $\hat{b}_{m-2}=(\hat{b}_{n-3},\hat{b}_{n-4})$ from paths into states at time m. Therefore, the computation of ISI estimates and branch metrics is in the critical path as it is the case for other multi-step trellises and values for L and K. Precomputing all one-step and two-step branch metrics can increase the maximum data rate. In total, for the considered exemplary channel model $2 \cdot 2^{L+1} = 2^{L+2}$ one-step branch metrics and $2^{L+2}$ two-step branch metrics are calculated. Without loss of generality, it is assumed that L and K are even. The invention can be easily applied to cases where L or K are not even. In the example considered here (L=4 and K=2), there are 64 precomputed one-step and two-step branch metrics.

Figure 9A:
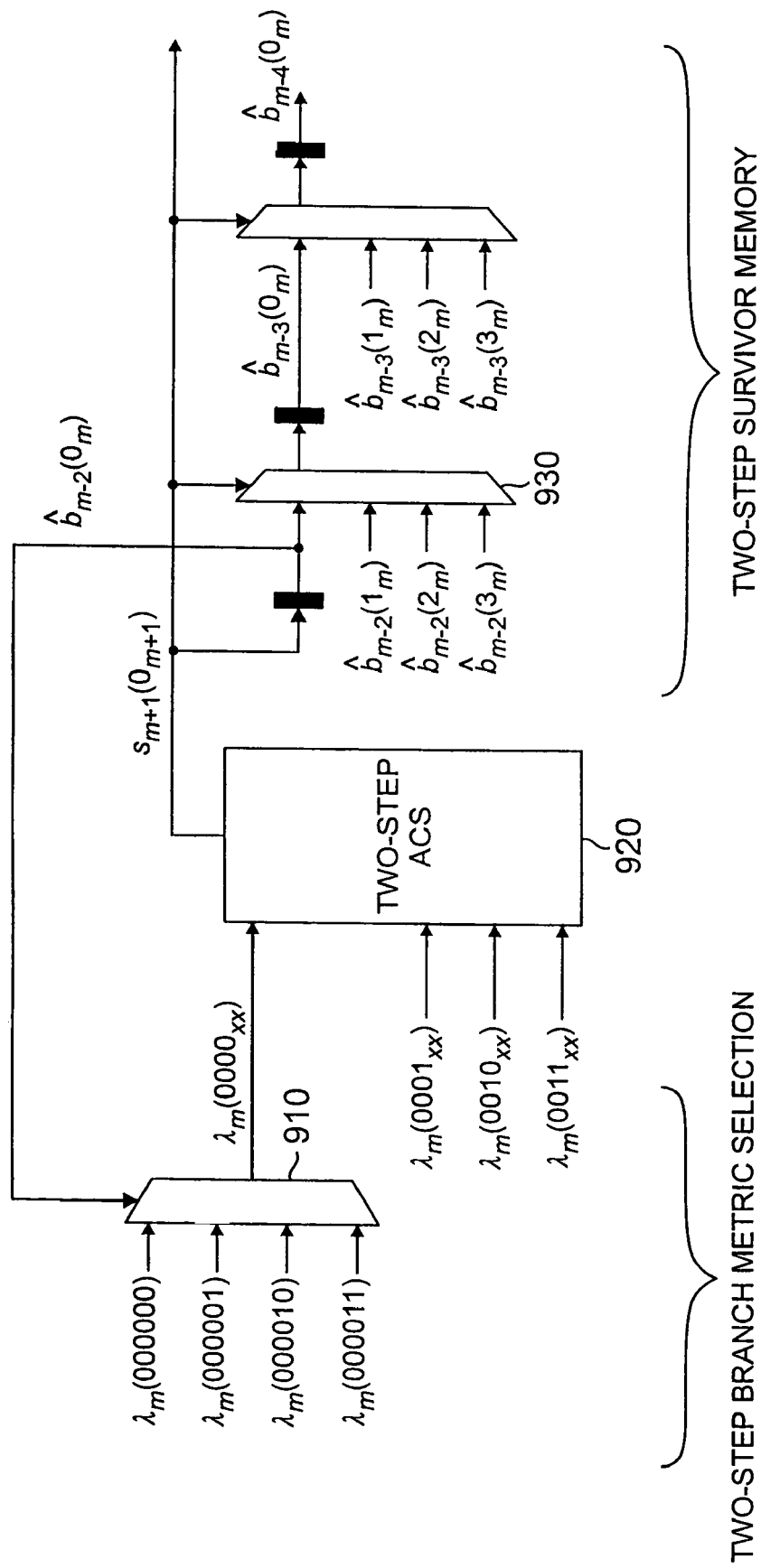
FIG. 9A is a schematic block diagram showing the selection of a multi-step branch metric using a multi-step survivor symbol, the multi-step ACS operation and multi-step survivor memory operation as performed by the reduced-state Viterbi detector of FIG. 8A.

FIG. 9A is a schematic block diagram of the multi-step branch metrics selection stage 820, multi-step ACS block 830 and multi-step survivor memory block 840 for a collapsed two-step trellis, where the channel memory is four, and the truncated channel memory considered by the reduced-state trellis is two (i.e., for L=4 and K=2). The corresponding two-step reduced-state trellis is shown in FIG. 7. As previously indicated, the selection of multi-step branch metrics is based on multi-step survivor symbols. In FIG. 9A, m indicates the multi-step time index, $\lambda_m$ is a multi-step branch metric, $s_{m+1}$ is a multi-step, two-bit ACS decision for the best path into a state $\sigma_{m+1}$ and $\hat{b}_{m-2}$ is a multi-step, two-bit survivor symbol for time step m−2.

There are $4^{(L-K)/2}$ potential two-step branch metrics $\lambda_m$ for each transition in the exemplary two-step trellis 700 of FIG. 7. $\lambda_m(000001)$ is the two-step branch metric for the bit sequence $(b_{n+1}b_nb_{n-1}b_{n-2}b_{n-3}b_{n-4})=(000001)$. $\lambda_m(0001\chi\chi)$ is the two-step branch metric for the bit sequence $(b_{n+1}b_nb_{n-1}b_{n-2}b_{n-3}b_{n-4})=(0001\chi\chi)$, where $\chi$ is a bit that is determined by a past survivor symbol. $\hat{b}_{m-2}(0_m)$ is a two-bit survivor symbol for time step m−2 from the survivor path into state 0 at time m. $s_{m+1}(0_{m+1})$ is a two-bit ACS decision for paths merging into state 0 at time m+1.

The required two-step branch metric for a particular transition can be selected using a $4^{(L-K)/2}$-to-1 multiplexer 910 that is driven by the (L−K)/2 two-step survivor symbols $\hat{b}_{m-K/2-1}, \hat{b}_{m-K/2-2}, \ldots \hat{b}_{m-L/2}$ from the path into the starting state of the transition. This is shown in FIG. 9A, for L=4, K=2 and a two-step transition from state $\sigma_m=0$ into state $\sigma_{m+1}=0$. $\lambda_m(0000\chi\chi)$ is the multi-step, e.g., two-step branch metric selected at stage 910 for a transition from state $0_m$ into state $0_{m+1}$. This multi-step branch metric is selected based on the multi-step, e.g., two-step, survivor symbol $\hat{b}_{m-2}(0_m)$, which is essentially equal to a pair of one-step survivor symbols from the survivor path into state $0_m$: $\hat{b}_{m-2}(0_m)=(\hat{b}_{n-3}(0_n),\hat{b}_{n-4}(0_n))$.

Figure 9B:
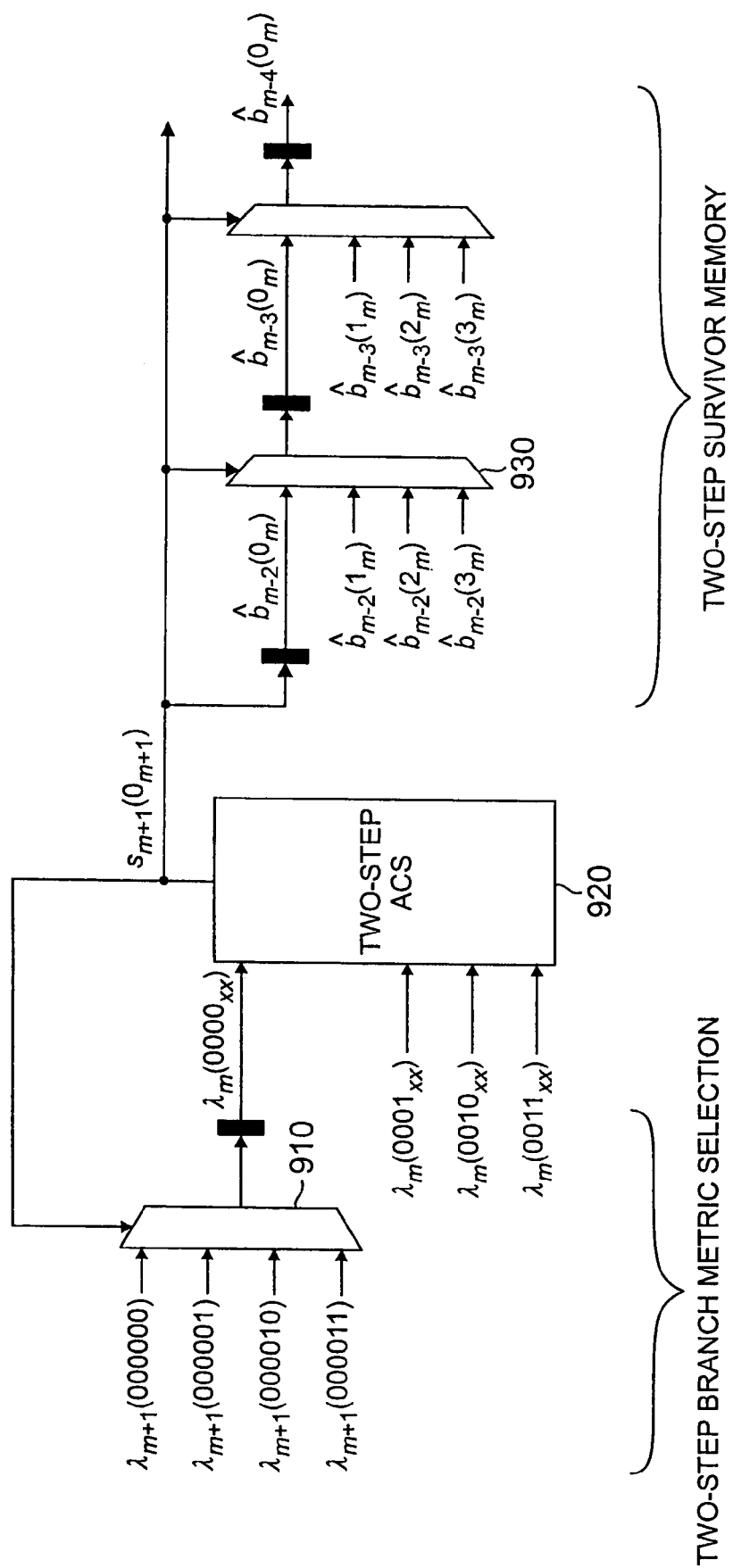
FIG. 9B is a schematic block diagram showing the selection of a multi-step branch metric using a multi-step ACS decision, the multi-step ACS operation and multi-step survivor memory operation as performed by the reduced-state Viterbi detector of FIG. 8B.

FIG. 9B is a schematic block diagram of another implementation of the multi-step branch metrics selection stage 820, multi-step ACS block 830 and multi-step survivor memory block 840 for the considered collapsed two-step trellis shown in FIG. 7 with L=4 and K=2. The difference to FIG. 9A is that in FIG. 9B the multi-step branch metric $\lambda_{m+1}(0000\chi\chi)$ is selected based on the multi-step, e.g., two-step, ACS decision $s_{m+1}(0_{m+1})$ that indicates the best path merging into state $0_{m+1}$ at time m+1. The two-step ACS decision $s_{m+1}(0_{m+1})$ is essentially a pair of 1-step ACS decision for the best path merging into a state $\sigma_{n+1}$ at time n+1 and finally reaching state $0_{n+2}$ in the full-state trellis (note that by definition $0_{n+2}=0_{m+1}$).

FIGS. 9A and 9B show only the selection of one multi-step branch metric, and the multi-step ACS and survivor memory block for one trellis state. In the multi-step reduced-state Viterbi detector 800, the circuits shown in FIGS. 9A and 9B would be implemented for all branch metrics and trellis states, as it is apparent to a person of ordinary skill in the art.

Compared to a one-step implementation with precomputed branch metrics, the throughput is almost doubled, as two trellis steps are processed in one clock period. The speed-up factor can be less than two, as a 4-to-1 multiplexer instead of a 2-to-1 multiplexer lies in the critical path. Also, a four-way instead of a two-way comparison has to be performed in the ACSU. To reduce the delay of the four-way comparison, the architecture of FIG. 12 should be implemented. Compared to a one-step implementation without precomputed branch metrics as shown in FIG. 6B, the architectures of FIG. 9A and FIG. 9B can achieve a throughput that is more than doubled, as the two-step processing approximately doubles the data rate, and additionally the computation of ISI estimates and branch metrics are not part of the critical path.

The critical path in FIG. 9A comprises the multiplexer 910 for the branch metric selection and a multi-step add-compare-select (ACS) 920. The critical path in FIG. 9B is determined mainly by the multi-step ACS function 920. The critical path in the implementations of FIG. 9A and FIG. 9B is significantly shorter compared to a conventional implementation of a reduced-state Viterbi detector with local feedback shown in FIG. 6B, as the computation of the ISI estimates and branch metrics is outside the critical path.

Figure 10:
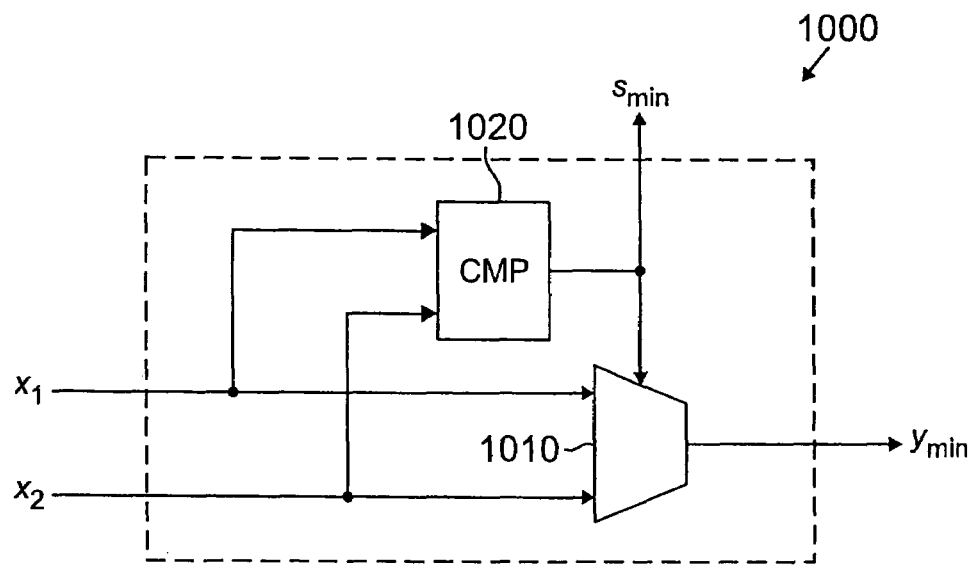
FIG. 10 is a functional block diagram for an exemplary 2-way compare-select operation used in FIG. 11.
Figure 11:
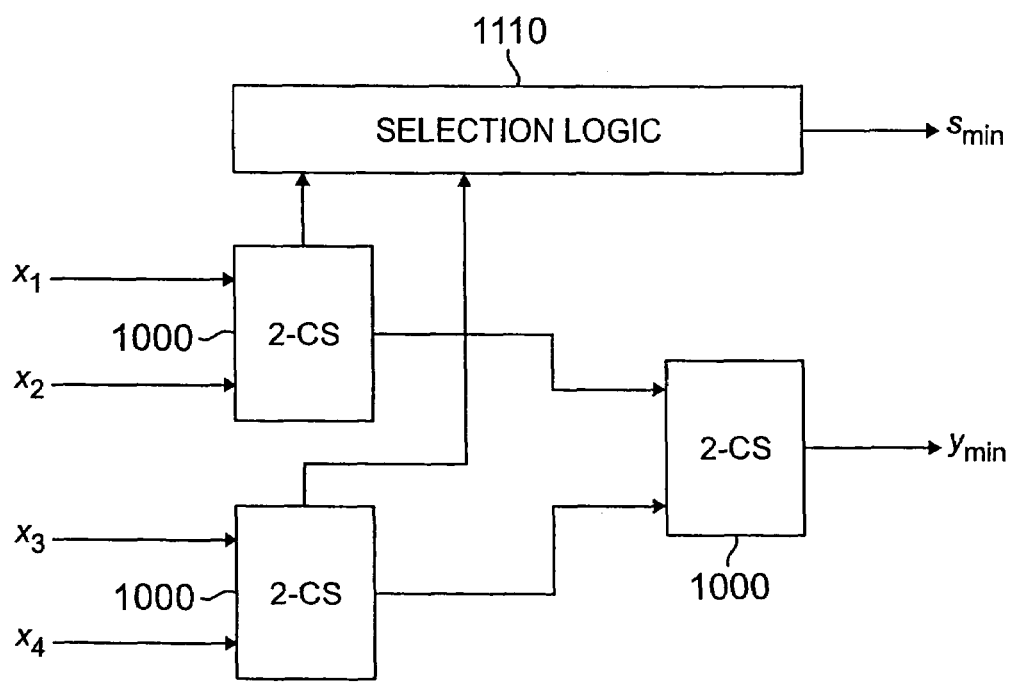
FIG. 11 is a functional block diagram of a 4-way compare-select cell using the 2-way compare-select cells of FIG. 10.

FIG. 10 is a functional block diagram 1000 for a 2-way compare-select operation, where $y_{min}$ is the minimum of $\chi_1$ and $\chi_2$ as determined by a comparator 1020 and selected by a multiplexer 1010, and $s_{min}$ is the corresponding 1-bit decision. The delay of the compare-select operation increases with B, the number of branches per trellis state. For B>2, the B-way compare-select operation can be implemented using 2-way compare-select (2-CS) cells as building blocks, which are arranged in a tree-like fashion to minimize the delay. This is shown in FIG. 11 for a 4-way compare-select cell 1100, where the final 2-bit decision is generated based on the 1-bit decisions of the 2-way compare-select cells 1000 under control of selection logic 1110.

In a tree-like B-way compare-select architecture with 2-way compare-select cells as building blocks, in total B−1 2-way compare-select cells are used, and the delay of the B-way compare-select cell is equal to $\log_2 B$ 2-way compare-select cells.

The delay of a B-way compare-select cell can be minimized with an architecture that compares all values at the same time using 2-way comparisons. Based on the results of all concurrent 2-way comparisons, the overall minimum value is selected. This architecture is shown for a 4-way compare-select cell in FIG. 12, where six 2-way comparisons are performed in parallel, and a 4-way multiplexer selects the minimum value based on the results of the 2-way comparisons.

When a B-way compare-select cell is implemented using exhaustive 2-way comparisons, in total $$\binom{B}{2} = \frac{B!}{2 \times (B-2)!} \quad (19)$$

2-way comparisons have to be performed. The delay is equal to one 2-way comparison and the delay of the selection logic and B-way multiplexer. This compare-select architecture 1200 shown in FIG. 12 requires more hardware (e.g., six comparators 1220-1 through 1220-6 and selection logic 1210) than the structure employing a tree-like arrangement of 2-way compare-select cells shown in FIG. 11, but it is associated with lower delay.

Figure 12:
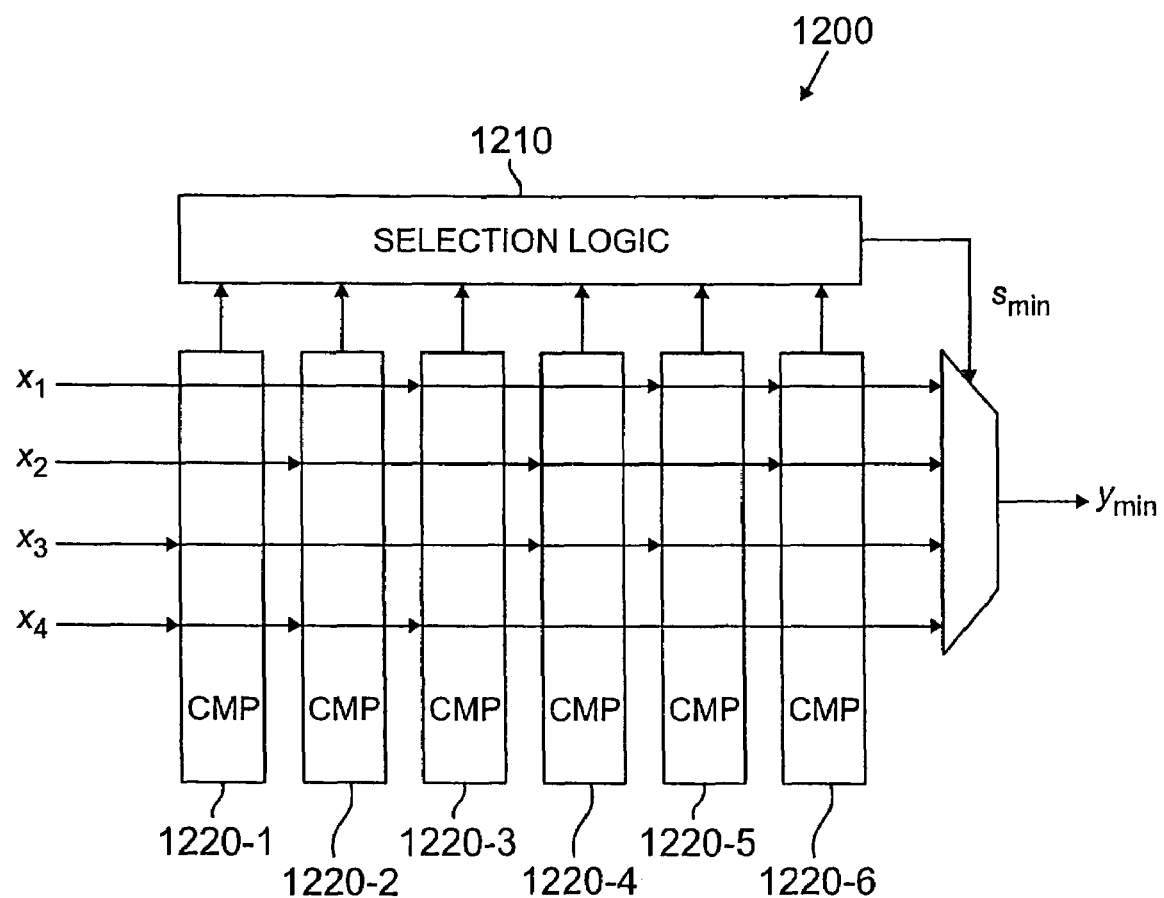
FIG. 12 is a functional block diagram of a 4-way compare-select cell that can be used in the two-step ACS operation shown in FIG. 13.
Figure 13:
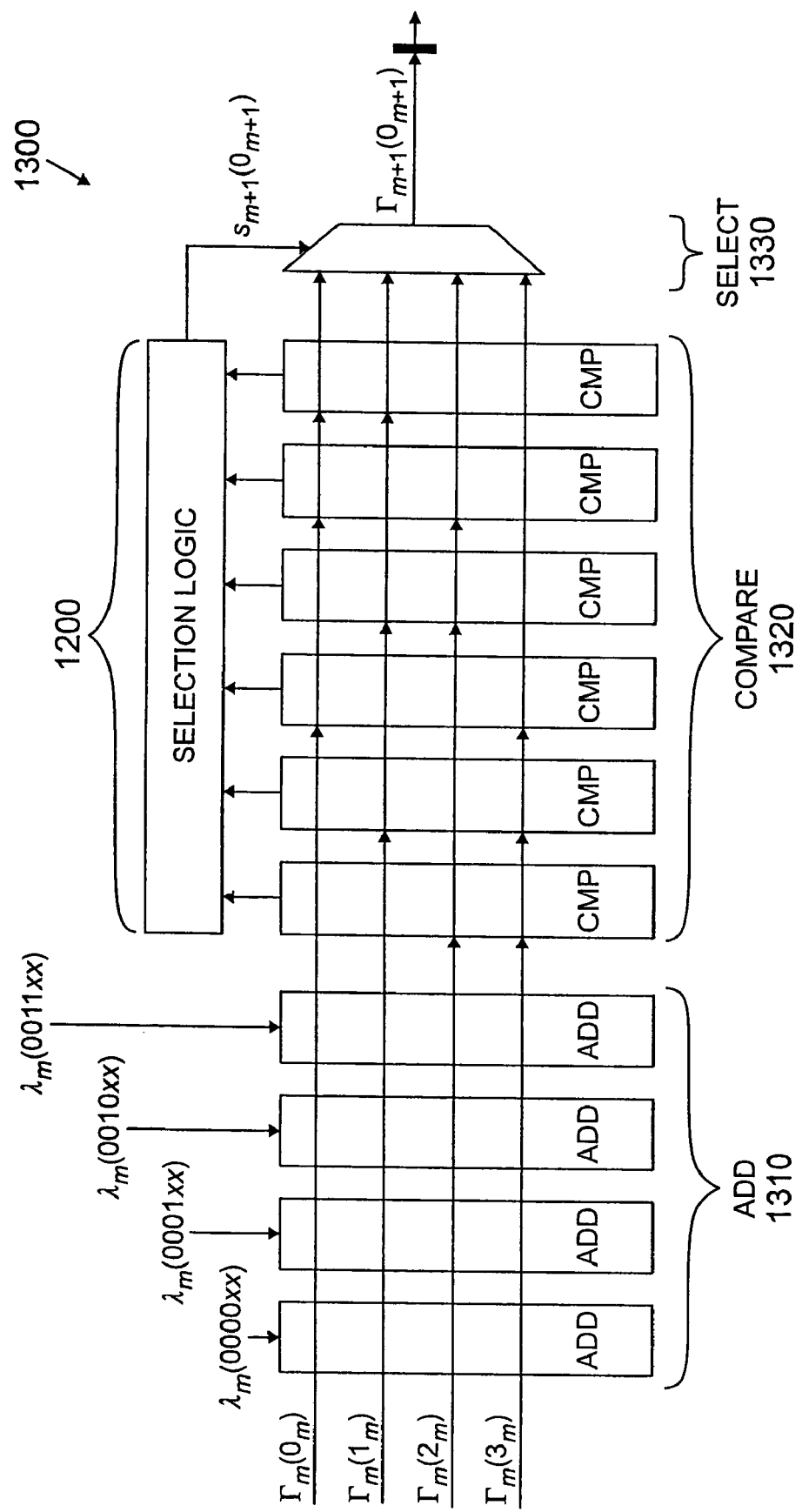
FIG. 13 is a functional block diagram of the two-step ACS operation of FIGS. 9A and 9B, for the exemplary two-step trellis of FIG. 7.

The 4-way compare-select structure 1200 of FIG. 12 can be used to implement the two-step ACS block of FIGS. 9A and 9B, and this is shown in FIG. 13, where the minimum path metric among the path extensions from the states $\sigma_m$ into state $\sigma_{m+1}$ is determined. This operation can be expressed by following equation:

$$\Gamma_{m+1}(\sigma_{m+1}) = \min_{\{\sigma_m\} \to \sigma_{m+1}} (\Gamma_m(\sigma_m) + \lambda_m(b_{n+1}b_n \ldots b_{n-L})). \quad (20)$$

FIG. 13 is a functional block diagram of the multi-step ACS operation of FIGS. 9A and 9B, for the exemplary two-step trellis of FIG. 7. As shown in FIG. 13, the multi-step ACS block 1300 includes an add function 1310, compare function 1320 and select function 1330. The exemplary add function 1310 includes four adders. The exemplary compare-select function 1320, 1330 is embodied using the 4-way compare-select structure 1200 of FIG. 12.

Figure 14:
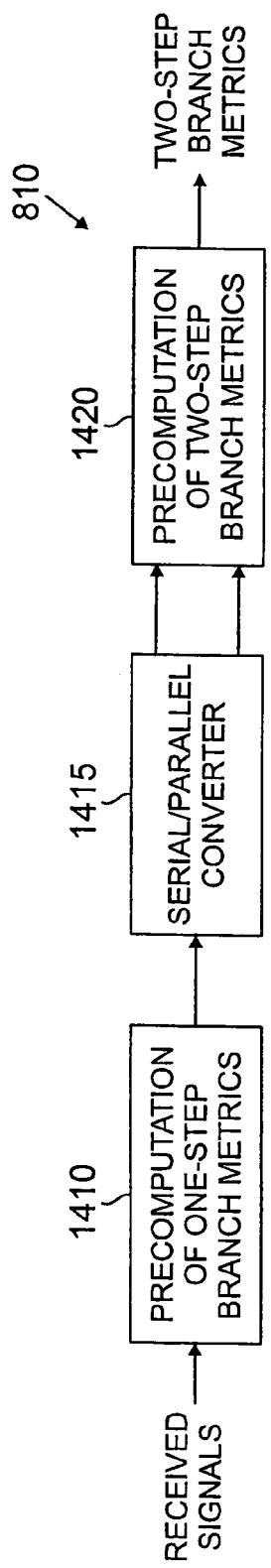
FIG. 14 is a functional block diagram of the multi-step branch metric precomputation of FIGS. 8A and 8B, for the exemplary two-step trellis of FIG. 7.

FIG. 14 shows an exemplary implementation of the multi-step precomputation 810 of FIGS. 8A and 8B. In this architecture, one-step branch metrics are precomputed at stage 1410 at the same clock rate as the original data rate. Then, the precomputed one-step branch metrics are passed through a serial-to-parallel converter 1415 after which all precomputed one-step branch metrics for all single transitions within a multi-step period are passed in parallel to the multi-step precomputation unit 1420. For example, for the exemplary two-step trellis of FIG. 7, all precomputed one-step branch metrics pertaining to transitions from time step n to n+1 are passed in parallel on the upper branch, and all precomputed one-step branch metrics pertaining to transitions from time step n+1 to n+2 are passed in parallel on the lower branch. The multi-step, i.e. two-step branch metric precomputation unit 1420 operates at the same clock rate as the multi-step ACSU, which is reduced compared to the clock rate associated with the original data symbol rate.

Figure 15:
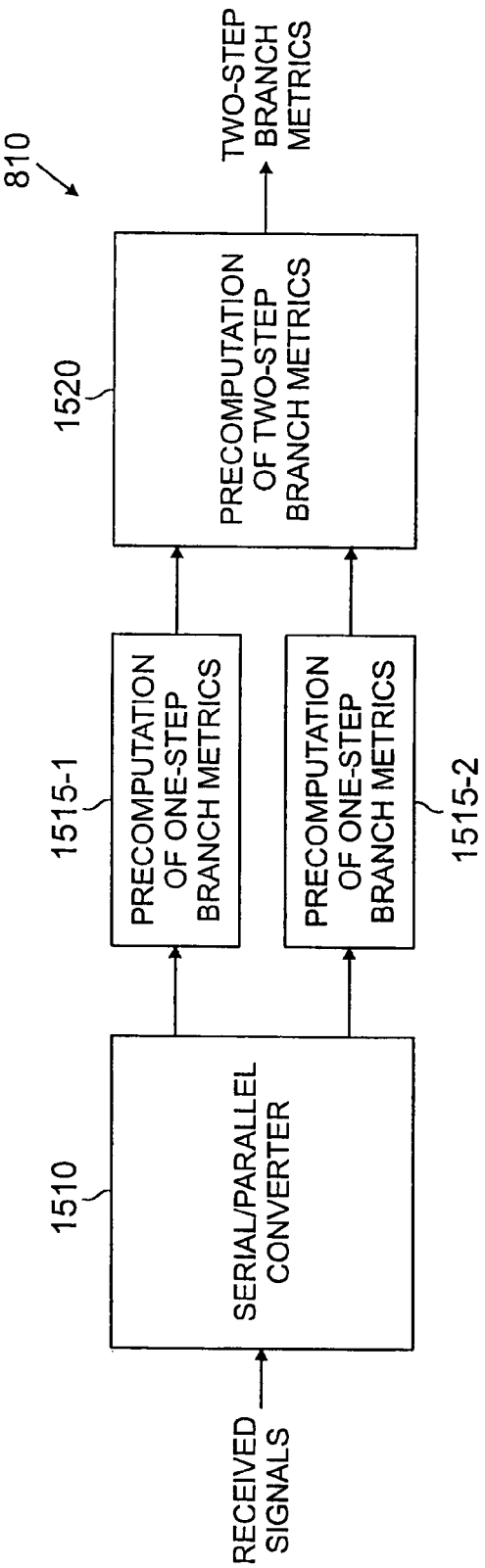
FIG. 15 is an alternative functional block diagram of the multi-step branch metric precomputation of FIGS. 8A and 8B, for the exemplary two-step trellis of FIG. 7.

FIG. 15 shows an alternative implementation of the multi-step precomputation 810 of FIGS. 8A and 8B. In contrast to FIG. 14, both the one-step branch metric and multi-step branch metric precomputation operate at the same clock rate as the multi-step ACSU, which is lower than the original data symbol rate. The received signals are first passed through a serial-to-parallel converter 1510. In the exemplary two-step implementation of FIG. 15, the received signal corresponding to time step n, i.e. $r_n$ is passed to the upper one-step precomputation block 1515-1, while the received signal corresponding to time step n+1, i.e. $r_{n+1}$ is passed to the lower one-step precomputation block 1515-2. Precomputed one-step branch metrics $\lambda_n$ for time step n are then passed to the two-step precomputation block 1520 using the upper lead, and in parallel one-step branch metrics $\lambda_{n+1}$ for time step n+1 are passed to the two-step precomputation block using the lower lead. It should be noted that other functional blocks can be placed between the serial/parallel converter 1510 and the one-step precomputation block 1515, e.g., an FIR equalizer (as explained below).

Among other benefits, the present invention allows for a VLSI implementation of reduced-state Viterbi detectors with local feedback for data rates that are effectively increased by at least a factor of two relative to conventional designs. Even larger data rate increases can be achieved when more than two steps are processed within one clock period in multi-step trellis. The invention uses an architecture that is very regular making it suitable for high-speed implementation. Viterbi detectors with local feedback can achieve better error rate performance than postprocessor-based structures in the magnetic recording application. Therefore, reduced-state Viterbi detection with local feedback is an attractive detector structure for future read channel chips. The use of reduced-state Viterbi detection with local feedback in the magnetic recording application is described in E. F. Haratsch, "Viterbi Detector Architectures for Magnetic Recording," 2003 International Symposium on VLSI Technology, Systems, and Applications, 243-46, Oct. 6-8, 2003. Post-processor based detector structures are discussed in Z. A. Keirn et al., "On the Use of Redundant Bits for Magnetic Recording: Single Parity Codes and Reed-Solomon ECC," IEEE Transactions on Magnetics, 225-30 (January 2004), and the references therein.

Magnetic Recording Read Channels

The techniques described herein can be employed, e.g., to detect data in the presence of intersymbol interference and noise in magnetic recording read channels. The disclosed multi-step reduced-state Viterbi detectors with local feedback improve the detection of read data bits compared to post-processor based structures. In particular, the invention can be used to implement a read channel that performs noise-predictive data detection and achieves the ever increasing high data rates that are required by evolving storage applications. For a discussion of noise-predictive detection in magnetic recording, see, e.g., R. D. Cideciyan et al., "Noise Predictive Maximum Likelihood Detection Combined With Parity-Based Post-Processing," IEEE Trans. on Magnetics, 714-20 (March 2001), and E. F. Haratsch, "Viterbi Detector Architectures for Magnetic Recording," International Symposium on VLSI Technology, Systems, and Applications, 243-46 (October 2003).

Figure 16:
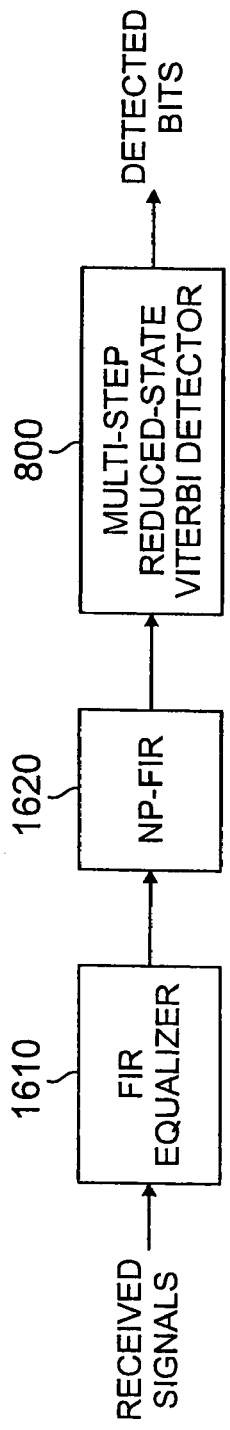
FIG. 16 is a functional block diagram of a read channel detector that implements noise-predictive data detection and uses the reduced-state Viterbi detector of FIG. 8A or 8B incorporating features of the invention.

The simplified block diagram for a read channel incorporating noise-predictive reduced-state Viterbi detection is shown in FIG. 16, where signals received at the input of the finite response (FIR) equalizer are in fact signals that have been processed by the analog front-end, which typically includes a variable gain amplifier, continuous time filter and A/D converter. The FIR equalizer 1610 shapes the channel impulse response such that the signals at the output of the FIR equalizer $y_n$ can be described by the equation $$y_n = \sum_{i=0}^{M} h_i \cdot a_{n-i} + v_n, \quad (21)$$

where $a_n$ are the data symbols defined as in equation (1), $h_i$ are the equalization target coefficients, M is the equalization target order, and $v_n$ is the noise at the output of the FIR equalizer. The equalization target is chosen such that its frequency spectrum matches the characteristics of the read channel well. The impulse response associated with the equalization target can be described by the equation:

$$H(D)=h_0+h_1 \cdot D+h_2 \cdot D^2+ \ldots +h_M \cdot D^M. \quad (22)$$

The error rate performance of a read channel can be improved by employing a noise-predictive FIR (NP-FIR) filter 1620 after the FIR equalizer that whitens the noise. The impulse response associated with the NP-FIR can be characterized with the polynomial:

$$P(D)=p_0+p_1 \cdot D+p_2 \cdot D^2+ \ldots +p_N \cdot D^N, \quad (23)$$

where $p_i$, $0 \leq i \leq N$ are the coefficients and N is the order of the NP-FIR filter.

The subsequent reduced-state Viterbi detector considers a channel response with the polynomial:

$$F(D)=f_0+f_1 \cdot D+f_2 \cdot D^2+ \ldots +f_{M+N} \cdot D^{M+N}=H(D) \cdot P(D), \quad (24)$$

and the signals at the input of the reduced-state Viterbi detector are given by:

$$r_n = \sum_{i=0}^{L} f_i \cdot a_{n-i} + w_n, \quad (25)$$

where $f_i$, $0 \leq i \leq L$, are the channel coefficients of the channel seen by the reduced-state Viterbi detector, L is the channel memory, and $w_n$ is the remaining noise at the output of NP-FIR filter. The channel memory L would be typically equal to L=M+N, but the reduced-state detector could also consider a channel with shorter channel memory, i.e. L<M+N. The channel coefficients $f_i$ are given by the convolution of the equalization target and NP-FIR filter. Equation (25) is equivalent to equation (2). Therefore, the features of the invention can be applied to the read channel application, i.e., a reduced-state can be defined as in equation (8), multi-step branch metrics can be precomputed as in equations (16)-(18), and a multi-step ACS operation can be performed as in equation (20). The invention allows for the implementation of the multi-step ACSU with a lower clock rate than the clock rate that is associated with the original data symbol rate. For example, for a data rate of 1 Gb/s and using a two-step reduced-state trellis, the two-step ACSU would operate at 500 Mb/s allowing for sufficient time to complete all operations along the critical path within one clock period, while other functional blocks of the read channel chip maybe implemented at the clock rate of 1 Gb/s that corresponds to the original data symbol rate.

The invention can also be applied when a parity code is used to achieve coding gain. For example, when a one-bit parity code is used, a state $\sigma_n$ in the full-state trellis is given by:

$$\sigma_n=(s_{n-1};b_{n-1},b_{n-2}, \ldots ,b_{n-L}), \quad (26)$$

where $s_n$ is the running parity syndrome given by the XOR-sum:

$$s_n=b_n \oplus s_{n-1}. \quad (27)$$

The total number of states in the reduced-state trellis is given by:

$$2 \times 2^L. \quad (28)$$

Analogous to equation (8), a state $\sigma_n$ in the reduced-state trellis can be defined by considering only the past K information bits or symbols:

$$\sigma_n=(s_{n-1}; b_{n-1},b_{n-2}, \ldots ,b_{n-K}), \quad (29)$$

and the number of states in the reduced-state trellis is equal to:

$$2 \times 2^K. \quad (30)$$

A conventional implementation of a Viterbi detector that considers the reduced-state trellis defined according to equation (29) would use equations (10)-(12) to compute branch and path metrics. However, due to the local feedback required for the computation of ISI estimates, it is challenging to achieve very high data rates. However, the maximum achievable data rate can again be increased significantly by multi-step detection using precomputed multi-step branch metrics as described above. For example, for L=4 and K=2, a two-step reduced-state trellis can be constructed using the underlying one-step reduced-state trellis as described above. A state $\sigma_m$ in the two-step reduced-state trellis is defined according to:

$$\sigma_m=(s_{m-1};b_{m-1},b_{m-2}, \ldots ,b_{m-K/2}), \quad (31)$$

where $s_m$ is the running two-step syndrome defined by:

$$s_m=s_{m-1} \oplus b_{n-1} \oplus b_{n-2}, \quad (32)$$

and $b_m$ is a two-step information symbol defined by:

$$b_m=(b_{n+1},b_n). \quad (33)$$

One-step and two-step branch metrics can be precomputed for possible bit sequences according to equations (16)-(18). As described above for L=4 and K=2, the required branch metric $\lambda_m(b_{n+1}b_nb_{n-1}b_{n-2}\chi\chi)$ for a transition from state $\sigma_m=(s_{m-1};b_{m-1})$ is selected among the precomputed branch metrics $\lambda_m(b_{n+1}b_nb_{n-1}b_{n-2}00)$, $\lambda_m(b_{n+1}b_nb_{n-1}b_{n-2}01)$, $\lambda_m(b_{n+1}b_nb_{n-1}b_{n-2}10)$, and $\lambda_m(b_{n+1}b_nb_{n-1}b_{n-2}11)$ based on the two-step survivor symbol $\hat{b}_{m-2}(\sigma_m)=(\hat{b}_{n-3}(\sigma_n),\hat{b}_{n-4}(\sigma_n))$ for the time m−2 from the path into state $\sigma_m=(s_{m-1};b_{m-1})$.

Figure 17:
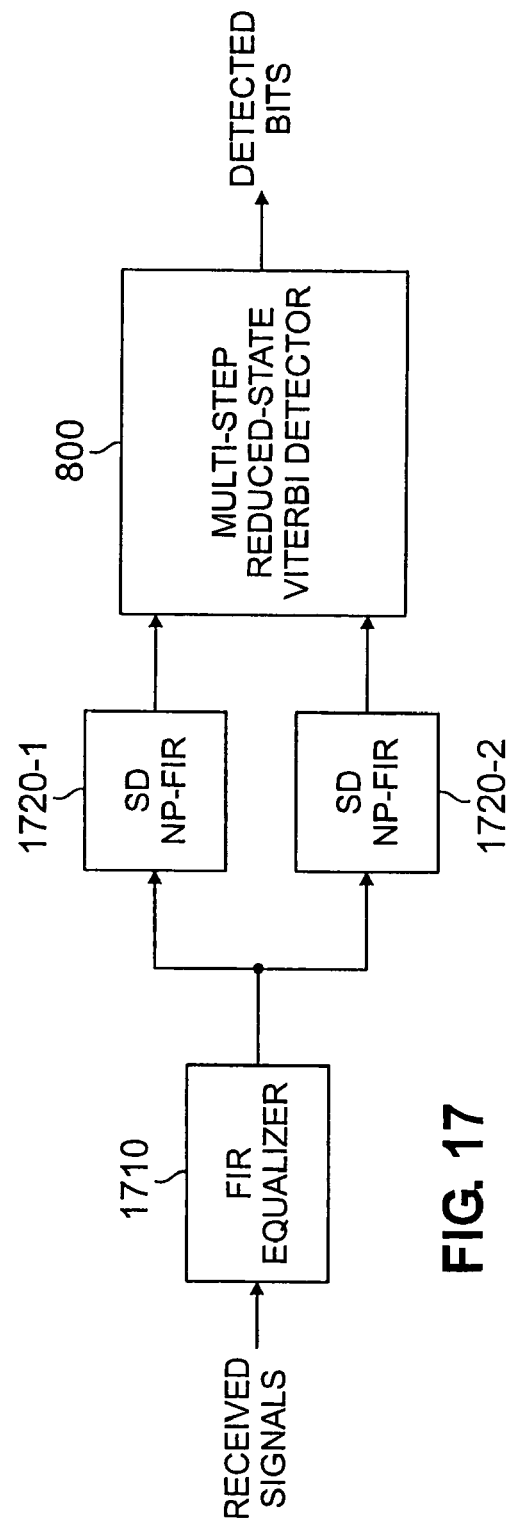
FIG. 17 is a functional block diagram of a read channel detector that implements signal-dependent noise-predictive data detection and uses the reduced-state Viterbi detector of FIG. 8A or 8B incorporating features of the invention.

The invention can also be applied to signal-dependent detection, which is sometimes referred to as data-dependent detection and explained in detail in the co-pending U.S. patent application Ser. No. 10/839,784, entitled "Method and Apparatus for Generating Filter Tap Weights and Biases for Signal Dependent Branch Metric Computation," incorporated by reference herein. In signal-dependent detection, more than one signal-dependent (SD) NP-FIR filters operate in parallel to whiten the noise. FIG. 17 illustrates this for the case that two SD NP-FIR filters 1720-1 and 1720-2 are used. The invention can easily be used when there are more than two SD NP-FIR filters 1720. In FIG. 17, the output of the FIR equalizer 1710 is supplied to two SD NP-FIR filters 1720-1 and 1720-2 to produce two signals $r_n(1)$ and $r_n(2)$. Each SD NP-FIR filter 1720 implements a polynomial described by equation (23) using a different set of coefficients. For example, the first SD NP-FIR filter 1720-1 that produces $r_n(1)$ uses a first set of coefficients $p_i(1)$, $0 \leq i \leq N$, whereas the second SD NP-FIR filter 1720-2 that produces $r_n(2)$ uses a second set of coefficients $p_i(2)$, $0 \leq i \leq N$ that can differ from the first set of NP-FIR filter coefficients The corresponding polynomials that describe the SD-NP FIR filters 1720 are denoted P(D;1) and P(D;2), e.g., $$P(D;1)=p_0(1)+p_1(1) \cdot D+ \ldots p_N(1) \cdot D^N. \quad (34)$$

The filter coefficients of the different SD NP-FIR filters 1720 can differ, as in a signal-dependent channel the noise statistics depend on the transmitted data or bit sequence. The generation of coefficient values for the SD NP-FIR filters is described in co-pending U.S. patent application Ser. No. 10/839,784, entitled "Method and Apparatus for Generating Filter Tap Weights and Biases for Signal Dependent Branch Metric Computation," incorporated by reference herein.

For the considered channel with 2 SD NP-FIR filters 1720, the reduced-state Viterbi detector 800 would compute branch metrics considering two different channel impulse responses with the polynomials F(D;1) and F(D;2) that are given by:

$$F(D;1)=f_0(1)+f_1(1)\cdot D+\ldots f_{M+N}(1)\cdot D^{M+N}=H(D)\cdot P(D;1), \text{ and} \quad (35)$$

$$F(D;2)=f_0(2)+f_1(2)\cdot D+\ldots f_{M+N}(2)\cdot D^{M+N}=H(D)\cdot P(D;2). \quad (36)$$

In a signal-dependent channel, the filter coefficients $f_i$ that are used to compute a one-step branch metric depend on the transmitted data or bit sequence. For 2 SD NP-FIR filters 1720, one-step branch metrics are computed according to equation (16) for a first group of bit sequences $(b_{n-1}b_{n-2}\ldots b_{n-L})$ using filter coefficients $f_i(1)$, and for a second group of bit sequences $(b_{n-1}b_{n-2}\ldots b_{n-L})$ the filter coefficients $f_i(2)$ are used.

For example, one-step branch metrics for transitions from states $\sigma_n$ to $\sigma_{n+1}$ that correspond to all bit sequences starting with $(b_n b_{n-1})=(00)$ or $(b_n b_{n-1})=(11)$ are computed using channel coefficients $f_i(1)$ and the sample $r_n(1)$:

$$\lambda_n(00b_{n-2}b_{n-3}\ldots b_{n-L}) = \left(r_n(1) - \sum_{i=0}^{L} f_i(1)\cdot a_{n-i}\right)^2, \quad (37)$$

$$\lambda_n(11b_{n-2}b_{n-3}\ldots b_{n-L}) = \left(r_n(1) - \sum_{i=0}^{L} f_i(1)\cdot a_{n-i}\right)^2. \quad (38)$$

One-step branch metrics for transitions from states $\sigma_{n+1}$ to $\sigma_{n+2}$ that correspond to all bit sequences starting with $(b_{n+1}b_n)=(00)$ or $(b_{n+1}b_n)=(11)$ are computed accordingly:

$$\lambda_{n+1}(00b_{n-1}b_{n-2}\ldots b_{n-L+1}) = \left(r_{n+1}(1) - \sum_{i=0}^{L} f_i(1)\cdot a_{n+1-i}\right)^2, \quad (39)$$

$$\lambda_{n+1}(11b_{n-1}b_{n-2}\ldots b_{n-L+1}) = \left(r_{n+1}(1) - \sum_{i=0}^{L} f_i(1)\cdot a_{n+1-i}\right)^2. \quad (40)$$

Continuing this example, one-step branch metrics for all bit sequences that start with $(b_n b_{n-1})=(01)$ or $(b_n b_{n-1})=(10)$ are computed using the second of channel coefficients $f_i(2)$ and the second sample $r_n(2)$:

$$\lambda_n(01b_{n-2}b_{n-3}\ldots b_{n-L}) = \left(r_n(2) - \sum_{i=0}^{L} f_i(2)\cdot a_{n-i}\right)^2, \quad (41)$$

$$\lambda_n(10b_{n-2}b_{n-3}\ldots b_{n-L}) = \left(r_n(2) - \sum_{i=0}^{L} f_i(2)\cdot a_{n-i}\right)^2. \quad (42)$$

One-step branch metrics for transitions from states $\sigma_{n+1}$ to $\sigma_{n+2}$ that correspond to all bit sequences starting with $(b_{n+1}b_n)=(01)$ or $(b_{n+1}b_n)=(10)$ are computed accordingly:

$$\lambda_{n+1}(01b_{n-1}b_{n-2}\ldots b_{n-L+1}) = \left(r_{n+1}(2) - \sum_{i=0}^{L} f_i(2)\cdot a_{n+1-i}\right)^2, \quad (43)$$

$$\lambda_{n+1}(10b_{n-1}b_{n-2}\ldots b_{n-L+1}) = \left(r_{n+1}(2) - \sum_{i=0}^{L} f_i(2)\cdot a_{n+1-i}\right)^2. \quad (44)$$

Comparing the signal-dependent one-step branch metric equations (37)-(44) with the non signal-dependent branch metric equations (16) and (18), signal-dependent one-step branch metrics are computed using the same underlying function, but the choice of the sample $r_n$ and channel coefficients $f_i$ depends to on the bit sequence for which the branch metric is computed. The precomputation of signal-dependent one-step branch metrics was illustrated here using two signal-dependent NP-FIR filters and a particular grouping of bit sequences, but it is apparent how signal-dependent one-step branch metrics are precomputed for more than two signal-dependent NP-FIR filters and other groupings. In this case, all possible bit sequences of length L would be divided into more than two groups, for which separate samples $r_n$ and separate sets of channel coefficients $f_i$ would be used to precompute one-step branch metrics.

A signal-dependent multi-step reduced-state Viterbi detector precomputes multi-step branch metrics in the same manner as a non-signal-dependent multi-step detector using equation (17) by combining corresponding one-step branch metrics. Also the selection of the correct multi-step branch metric, the multi-step ACS operation and the multi-step SMU are implemented as described above for the non-signal-dependent multi-step detector. Therefore all the benefits of the invention apply to signal-dependent detection as well.

It is to be understood that the embodiments and variations shown and described herein are merely illustrative of the principles of this invention and that various modifications may be implemented by those skilled in the art without departing from the scope and spirit of the invention.

We claim:

1. A method for processing a signal to detect one or more data bits, said method comprising the steps of:
    precomputing multi-step branch metrics for a multiple-step trellis for speculative sequences of one or more channel symbols, wherein each of said channel symbols represents one or more data bits;
    selecting a subset of said precomputed branch metrics for multi-step state transitions based on at least one multi-step decision from at least one corresponding state; and
    selecting a path having a best path metric for a given state.

2. The method of claim 1, wherein said step of precomputing multi-step branch metrics further comprises the steps of:
    precomputing one-step branch metrics for speculative sequences of one or more channel symbols; and
    combining corresponding precomputed one-step branch metrics to compute said multi-step branch metrics.

3. The method of claim 2, wherein said step of precomputing one-step branch metrics is performed at the rate of a one-step trellis and said multi-step branch metrics are computed at a rate of said multi-step trellis.

4. The method of claim 2, wherein said step of precomputing one-step branch metrics is performed at a rate of 1/n of the data rate along n parallel paths, where n is the number of steps in an original one-step reduced-state trellis that are processed at once by said multi-step trellis.

5. The method of claim 1, wherein said processing of said signal is performed using a reduced-state sequence estimation technique; delayed decision-feedback sequence estimation technique; parallel decision-feedback equalization technique; or an implementation of a Viterbi algorithm.

6. The method of claim 1, wherein said multi-step decision is a multi-step survivor symbol.

7. The method of claim 6, wherein said multi-step survivor symbol is a group of one-step survivor symbols.

8. The method of claim 1, wherein said multi-step decision is a multi-step add-compare-select decision.

9. The method of claim 8, wherein said multi-step add-compare-select decision is a group of one-step add-compare-select decisions.

10. The method of claim 1, wherein said multiple-step trellis includes syndrome information for a parity check code.

11. The method of claim 1, further comprising the steps of:
processing a received signal using an FIR equalizer to generate an equalized received signal; and
processing said equalized received signal using a noise-predictive FIR filter to generate said signal.

12. The method of claim 11, wherein said signal is a noise whitened signal.

13. The method of claim 11, wherein channel coefficients used to precompute said multi-step branch metrics are a convolution of impulse responses of said FIR equalizer and said noise-predictive FIR filter.

14. The method of claim 1, further comprising the steps of:
processing a received signal using an FIR equalizer to generate an equalized received signal; and
processing said equalized received signal using a plurality of noise-predictive FIR filters to generate a plurality of signals.

15. The method of claim 14, wherein said plurality of noise-predictive FIR filters each use a corresponding set of filter coefficients.

16. The method of claim 15, wherein a set of channel coefficients used to precompute said multi-step branch metrics is dependent on a bit pattern, and wherein said set of channel coefficients is given by a convolution of impulse responses of said FIR equalizer and one of said plurality of noise-predictive FIR filters.

17. The method of claim 14, wherein said step of precomputing multi-step branch metrics uses an output of one of said plurality of noise-predictive FIR filters based on characteristics of the data.

18. The method of claim 1, wherein said multiple-step trellis is a two-step trellis.

19. The method of claim 18, wherein said step of precomputing multi-step branch metrics precomputes two-step branch metrics by:
precomputing one-step branch metrics for speculative sequences of one or more channel symbols; and
combining corresponding precomputed one-step branch metrics.

20. The method of claim 18, wherein said step of precomputing one-step branch metrics is performed at a rate of half of the data rate along two parallel paths.

21. The method of claim 18, wherein said two-step decision is a pair of one-step survivor symbols.

22. The method of claim 18, wherein said two-step decision is a pair of one-step add-compare-select decisions.

23. The method of claim 18, wherein when one step is processed in said two-step trellis two steps from an original one-step reduced-state trellis are processed at once.

24. The method of claim 1, wherein said signal is a read channel signal.

25. A signal processor for processing a signal to detect one or more data bits, comprising:
a branch metrics unit for precomputing multi-step branch metrics for a multiple-step trellis for speculative sequences of one or more channel symbols, wherein each of said channel symbols represents one or more data bits;
a multiplexer for selecting a subset of said precomputed branch metrics for multi-step state transitions based on at least one multi-step decision from at least one corresponding state; and
an add-compare-select unit for selecting a path having a best path metric for a given state.

* * * * *